(12) United States Patent
Watanabe et al.

(10) Patent No.: US 11,985,736 B2
(45) Date of Patent: May 14, 2024

(54) FLUID HEATING DEVICE

(71) Applicant: KELK Ltd., Kanagawa (JP)

(72) Inventors: Daisuke Watanabe, Kanagawa (JP); Junji Muko, Kanagawa (JP)

(73) Assignee: KELK Ltd., Kanagawa (JP)

( * ) Notice: Subject to any disclaimer, the term of this patent is extended or adjusted under 35 U.S.C. 154(b) by 827 days.

(21) Appl. No.: 17/041,277

(22) PCT Filed: Feb. 4, 2019

(86) PCT No.: PCT/JP2019/003880
§ 371 (c)(1),
(2) Date: Sep. 24, 2020

(87) PCT Pub. No.: WO2019/193827
PCT Pub. Date: Oct. 10, 2019

(65) Prior Publication Data
US 2021/0112628 A1    Apr. 15, 2021

(30) Foreign Application Priority Data
Apr. 4, 2018  (JP) .................................. 2018-072700

(51) Int. Cl.
*H05B 3/02* (2006.01)
*B08B 3/08* (2006.01)
(Continued)

(52) U.S. Cl.
CPC ............ *H05B 3/0047* (2013.01); *B08B 3/08* (2013.01); *B08B 3/10* (2013.01); *F24H 1/12* (2013.01);
(Continued)

(58) Field of Classification Search
None
See application file for complete search history.

(56) References Cited

U.S. PATENT DOCUMENTS 5,054,107 A * 10/1991 Batchelder .............. F24H 1/121
                                                    392/483
5,740,315 A *  4/1998 Onishi .................... F24H 1/121
                                                    392/483
(Continued)

FOREIGN PATENT DOCUMENTS

CN        2405159      11/2000
CN        1385844      12/2002
(Continued)

OTHER PUBLICATIONS

TW Office Action for Taiwanese Application No. 108106727, dated Nov. 5, 2019, with English Translation, 6 pages.

*Primary Examiner* — Joseph M. Pelham
(74) *Attorney, Agent, or Firm* — Fish & Richardson P.C.

(57) ABSTRACT

A fluid heating device includes a container in which fluid is supplied between an inner surface of an outer cylindrical member and outer surfaces of the inner cylindrical members, lamp heaters arranged in an inner cylindrical members, a nozzle member arranged on a leading end side of the lamp heaters and having an air supply port, and a guide mechanism that guides gas supplied from the air supply port of the nozzle member. The inner cylindrical members include a central inner cylindrical member arranged at a center of the outer cylindrical member, and peripheral inner cylindrical members arranged around the central inner cylindrical member. The lamp heaters include a central lamp heater arranged in the central inner cylindrical member and peripheral lamp heaters respectively arranged in the peripheral inner cylindrical members. The guide mechanism guides the gas to a leading end side of the central lamp heater.

16 Claims, 17 Drawing Sheets

(51) Int. Cl.
    *B08B 3/10*     (2006.01)
    *F24H 1/12*     (2022.01)
    *F24H 1/14*     (2022.01)
    *H05B 3/00*     (2006.01)
    *H05B 3/08*     (2006.01)
    *B08B 3/04*     (2006.01)
    *B08B 3/14*     (2006.01)
    *G03F 7/30*     (2006.01)
    *H01L 21/67*     (2006.01)

(52) U.S. Cl.
    CPC ............ *H05B 3/08* (2013.01); *B08B 3/048* (2013.01); *B08B 3/14* (2013.01); *B08B 2203/007* (2013.01); *G03F 7/3085* (2013.01); *H01L 21/6704* (2013.01); *H05B 3/0052* (2013.01); *H05B 2203/021* (2013.01); *H05B 2203/032* (2013.01)

(56) References Cited

U.S. PATENT DOCUMENTS

| | | |
|---|---|---|
| 8,282,879 B2 | 10/2012 | Tanaka |
| 8,670,656 B2 | 3/2014 | Nishida et al. |
| 8,684,233 B2 | 4/2014 | Nishio et al. |
| 9,480,996 B2 | 11/2016 | Reiland et al. |
| 9,485,807 B2 * | 11/2016 | Uchida ............... F24H 1/121 |
| 10,626,500 B2 | 4/2020 | Shah et al. |
| 2003/0026603 A1 * | 2/2003 | Castaneda ........... F24H 1/142 |
| | | 392/483 |
| 2009/0269240 A1 | 10/2009 | Tanaka |
| 2011/0008028 A1 | 1/2011 | Maeda et al. |
| 2011/0253739 A1 | 10/2011 | Nishio et al. |
| 2012/0063754 A1 | 3/2012 | Nishida et al. |
| 2014/0076931 A1 | 3/2014 | Reiland et al. |
| 2015/0329966 A1 | 11/2015 | Shah et al. |
| 2017/0138633 A1 | 5/2017 | Dominguez et al. |

FOREIGN PATENT DOCUMENTS

| | | | |
|---|---|---|---|
| CN | 101447201 | | 6/2009 |
| CN | 101983537 | | 3/2011 |
| CN | 101365654 | | 9/2012 |
| CN | 102186403 | | 4/2014 |
| CN | 102401465 | | 9/2014 |
| CN | 104640642 | | 4/2017 |
| CN | 106839397 | | 6/2017 |
| CN | 107134424 | | 9/2017 |
| CN | 106463344 | | 10/2019 |
| CN | 116336285 A | * | 6/2023 |
| EP | 1699071 | | 6/2009 |
| JP | H05267179 | | 10/1993 |
| JP | H07-91853 | | 4/1995 |
| JP | H09-097781 | | 4/1997 |
| JP | 10281583 A | * | 10/1998 |
| JP | H1137558 | | 2/1999 |
| JP | 2003090614 | | 3/2003 |
| JP | 200397849 | | 4/2003 |
| JP | 4147664 | | 9/2008 |
| JP | 2015169396 | | 9/2015 |
| JP | 2015179722 | | 10/2015 |
| JP | 6006007 | | 10/2016 |
| KR | 20100113637 | | 10/2010 |
| TW | 201015032 | | 4/2010 |
| WO | WO2009/123045 | | 8/2009 |
| WO | WO-2009123045 A1 * | 10/2009 | ............ F24H 1/101 |

* cited by examiner

FLUID HEATING DEVICE

CROSS-REFERENCE TO RELATED APPLICATIONS

This application is a National Stage application of International Application No. PCT/JP2019/003880, filed on Feb. 4, 2019, which claims priority to Japanese Patent Application No. 2018-072700, filed on Apr. 4, 2018. The contents of the prior applications are incorporated herein in their entirety.

FIELD

The present invention relates to a fluid heating device.

BACKGROUND

In a semiconductor manufacturing process, various chemical solutions such as a semiconductor wafer cleaning chemical solution and a photoresist stripping chemical solution are used. A chemical solution used in the semiconductor manufacturing process is used in a state of being heated by a fluid heating device. The fluid heating device includes a lamp heater such as a halogen lamp. The fluid heating device heats the chemical solution with radiant heat of the lamp heater. An excessive temperature rise in the lamp heater can cause a decrease in performance of the fluid heating device. Thus, a technology of supplying gas to the lamp heater to control an excessive temperature rise in the lamp heater has been proposed.

CITATION LIST

Patent Literature

Patent Literature 1: Japanese Laid-open Patent Publication No. 09-097781

SUMMARY

Technical Problem

In order to perform a temperature adjustment of a large amount of chemical solution, a high output of a fluid heating device is required. There is a demand for a technology capable of controlling an excessive temperature rise in a lamp heater and controlling a decrease in a life and an early failure of a fluid heating device even when a high output of the fluid heating device is realized.

In order to realize both of a high output and compactness of a fluid heating device, an aspect of the present invention is to control an excessive temperature rise in a lamp heater and to control a decrease in a life and early failure when the number of lamp heaters is increased instead of powering-up of a single lamp heater and many lamp heaters are arranged in one container.

Solution to Problem

According to an aspect of the present invention, a fluid heating device comprises: a container which has an outer cylindrical member and inner cylindrical members arranged inside the outer cylindrical member, fluid being supplied to a fluid space between an inner surface of the outer cylindrical member and outer surfaces of the inner cylindrical members in the container; lamp heaters arranged in the inner cylindrical members; a first nozzle member arranged on a leading end side of the lamp heaters and having an air supply port; and a first guide mechanism that guides first gas supplied from the air supply port of the first nozzle member, wherein the inner cylindrical members include a central inner cylindrical member arranged at a center of the outer cylindrical member in a plane orthogonal to a central axis of the outer cylindrical member, and a plurality of peripheral inner cylindrical members arranged around the central inner cylindrical member, the lamp heaters include a central lamp heater arranged in the central inner cylindrical member, and peripheral lamp heaters respectively arranged in the plurality of peripheral inner cylindrical members, and the first guide mechanism guides the first gas to a leading end side of the central lamp heater.

Advantageous Effects of Invention

According to an aspect of the present invention, even when a high output of a fluid heating device is realized, it is possible to control an excessive temperature rise in a lamp heater and to control a decrease in a life, and early failure.

DESCRIPTION OF EMBODIMENTS

In the following, embodiments according to the present invention will be described with reference to the drawings. However, the present invention is not limited to this. Components of the embodiments described in the following can be arbitrarily combined. Also, there is a case where a part of the components is not used.

In the following description, an XYZ Cartesian coordinate system is set, and a positional relationship of each part will be described with reference to this XYZ Cartesian coordinate system. A direction parallel to an X-axis in a horizontal plane is an X-axis direction, a direction parallel to a Y-axis orthogonal to the X-axis in the horizontal plane is a Y-axis direction, and a direction parallel to a Z-axis orthogonal to the horizontal plane is a Z-axis direction.

First Embodiment

[Fluid System]

Figure 1:
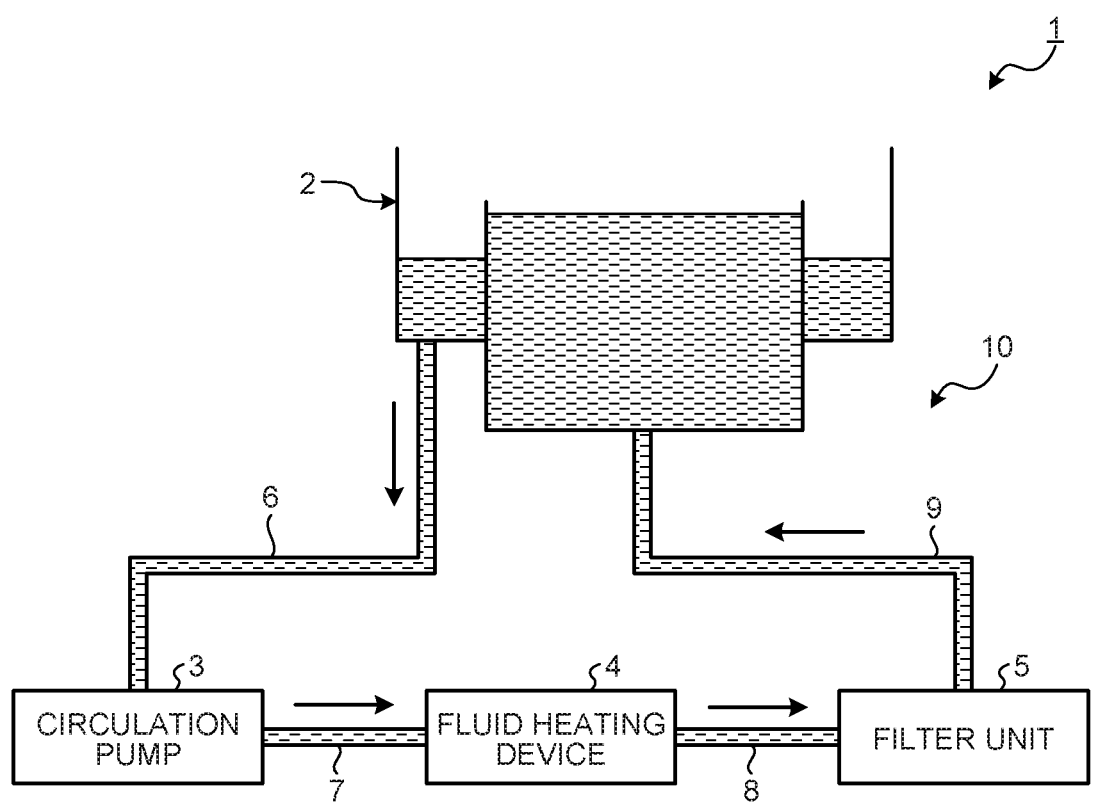
FIG. 1 is a view schematically illustrating an example of a fluid system according to a first embodiment.

FIG. 1 is a view schematically illustrating an example of a fluid system 1 according to the present embodiment. The fluid system 1 includes a processing tank 2, a circulation pump 3, a fluid heating device 4, a filter unit 5, a first connecting pipe 6 that connects the processing tank 2 and the circulation pump 3, a second connecting pipe 7 that connects the circulation pump 3 and the fluid heating device 4, a third connecting pipe 8 that connects the fluid heating device 4 and the filter unit 5, and a fourth connecting pipe 9 that connects the filter unit 5 and the processing tank 2.

The processing tank 2, the first connecting pipe 6, the circulation pump 3, the second connecting pipe 7, the fluid heating device 4, the third connecting pipe 8, the filter unit 5, and the fourth connecting pipe 9 form a fluid circulation system 10.

The circulation pump 3 circulates fluid in the circulation system 10. The circulation pump 3 sucks and discharges fluid supplied from the processing tank 2 through the first connecting pipe 6. The fluid discharged from the circulation pump 3 is supplied to the fluid heating device 4 through the second connecting pipe 7.

The fluid heating device 4 heats the fluid supplied from the circulation pump 3 through the second connecting pipe 7, and delivers the fluid to the third connecting pipe 8. The filter unit 5 collects a foreign substance in the fluid supplied from the fluid heating device 4 through the third connecting pipe 8. The fluid from which the foreign substance is removed by the filter unit 5 is supplied to the processing tank 2 through the fourth connecting pipe 9.

The fluid which is heated by the fluid heating device 4 and from which the foreign substance is removed by the filter unit 5 is housed in the processing tank 2. With the fluid housed in the processing tank 2, semiconductor manufacturing processes such as semiconductor wafer cleaning and photoresist stripping are performed. Examples of the fluid include chemical solutions that are used for the semiconductor manufacturing processes and that are, for example, a semiconductor wafer cleaning chemical solution and a photoresist stripping chemical solution. Note that the fluid heated by the fluid heating device 4 may be liquid other than a chemical solution.

[Fluid Heating Device]

Figure 2:
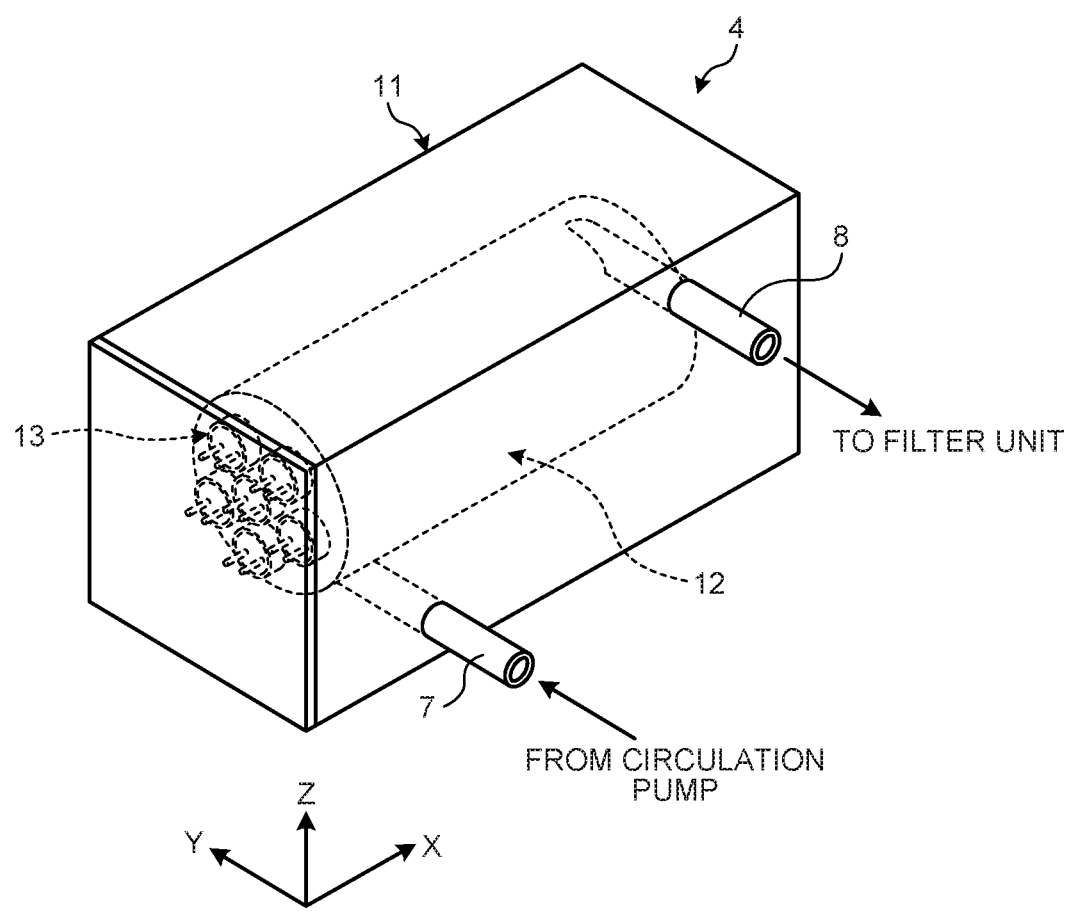
FIG. 2 is a perspective view schematically illustrating a fluid heating device according to the first embodiment.

FIG. 2 is a perspective view schematically illustrating a fluid heating device 4 according to the present embodiment. The fluid heating device 4 includes a case 11, a container 12 arranged inside the case 11, and a plurality of lamp heaters 13 held in the container 12. The container 12 is connected to each of the second connecting pipe 7 and the third connecting pipe 8. Fluid from the circulation pump 3 is supplied to the container 12 through the second connecting pipe 7. With radiant heat of the lamp heaters 13, the fluid heating device 4 heats the fluid supplied to the container 12. The fluid heated by the lamp heaters 13 is delivered to the filter unit 5 through the third connecting pipe 8.

Figure 3:
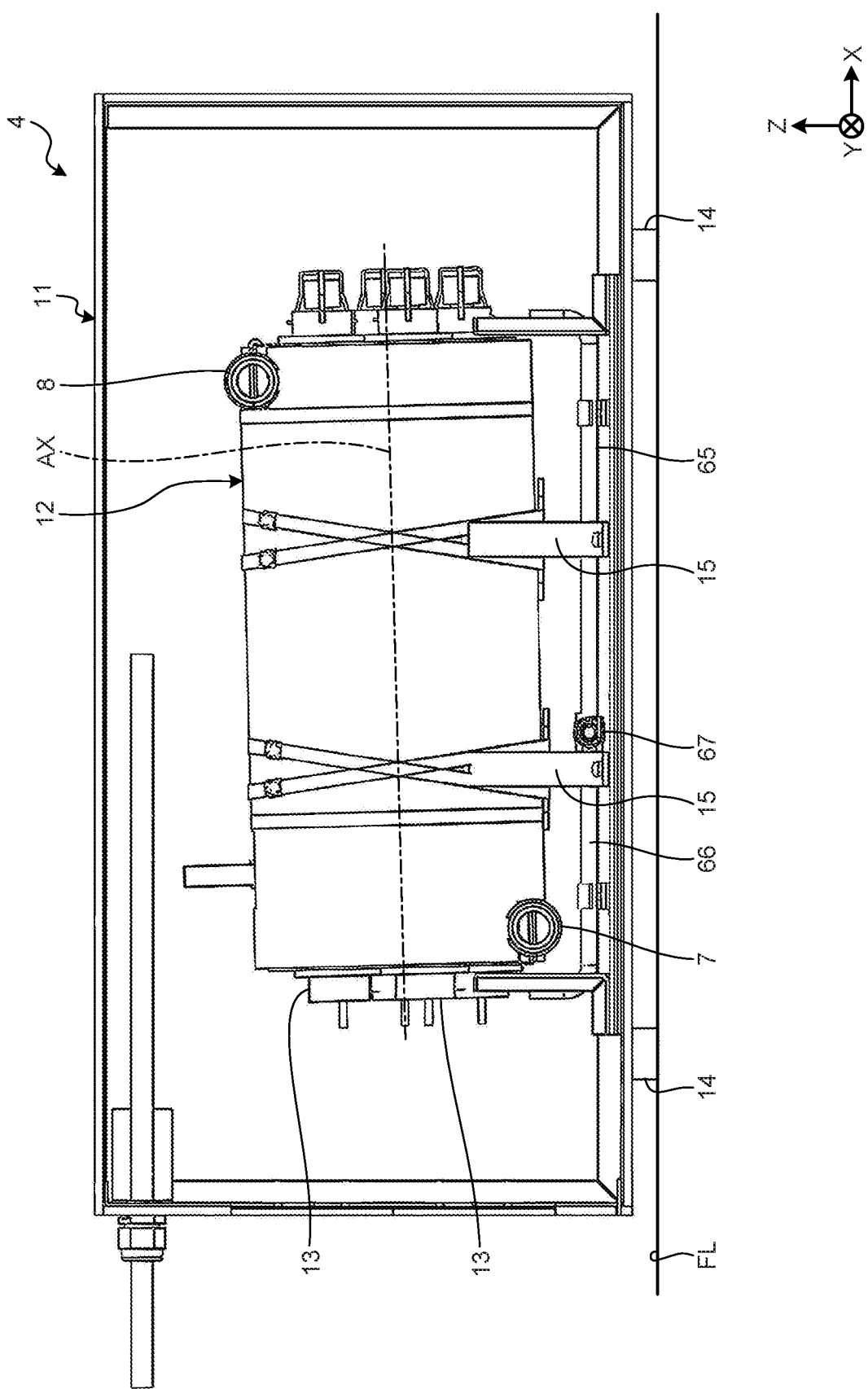
FIG. 3 is a view illustrating an inner part of a case according to the first embodiment.
Figure 4:
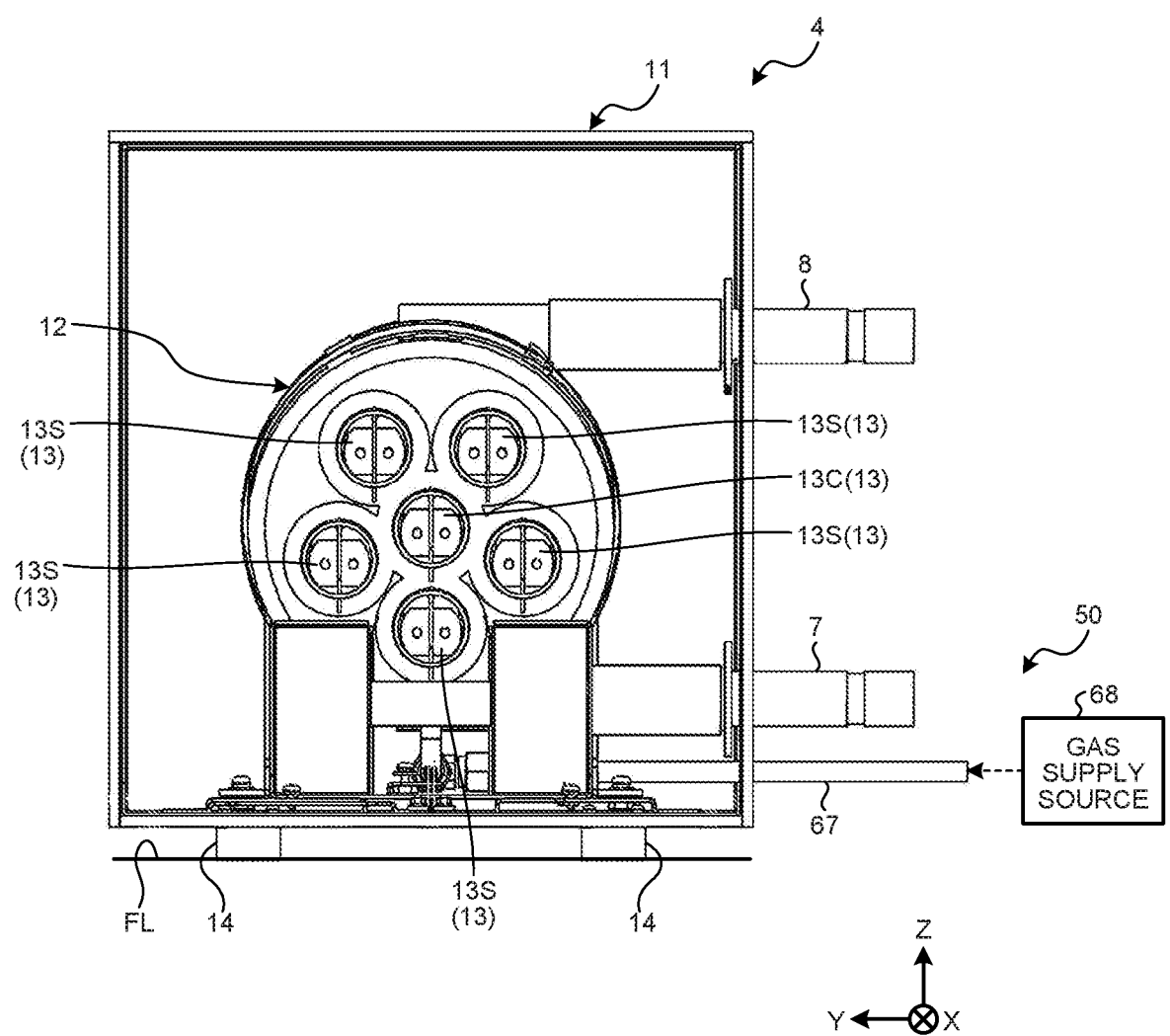
FIG. 4 is a view illustrating the inner part of the case according to the first embodiment.

Each of FIG. 3 and FIG. 4 is a view illustrating an inner part of the case 11 according to the present embodiment. FIG. 3 is a view of the inner part of the case 11 viewed from a −Y side, and FIG. 4 is a view of the inner part of the case 11 viewed from a −X side.

Leg members 14 are fixed to a lower surface of the case 11. The case 11 is supported on a floor surface FL via the leg members 14. The floor surface FL is parallel to a horizontal plane.

The container 12 has a cylindrical shape. A central axis AX of the container 12 is parallel to an XZ plane. The container 12 is held by a container holding mechanism 15. The container holding mechanism 15 is fixed to a bottom surface of the case 11. The container holding mechanism 15 holds the container 12 in such a manner that a central axis AX of the container 12 is inclined with respect to the horizontal plane. The central axis AX is inclined in a +Z direction toward a +X direction. An angle of the central axis AX with respect to the horizontal plane is, for example, 1[°] or more and 4[°] or less. That is, the central axis AX is substantially parallel to the X-axis, but is slightly inclined with respect to the horizontal plane.

Each of the lamp heaters 13 is long in the X-axis direction. The plurality of lamp heaters 13 is held in the container 12. As illustrated in FIG. 4, the lamp heaters 13 include a central lamp heater 13C arranged at a center of the container 12 in a plane parallel to a YZ plane, and a plurality of peripheral lamp heaters 13S arranged around the central lamp heater 13C. In the present embodiment, there are five peripheral lamp heaters 13S. That is, in the present embodiment, the total number of the lamp heaters 13 held in the container 12 is six. The peripheral lamp heaters 13S are arranged at regular intervals around the central lamp heater 13S.

[Lamp Heater]

Figure 5:
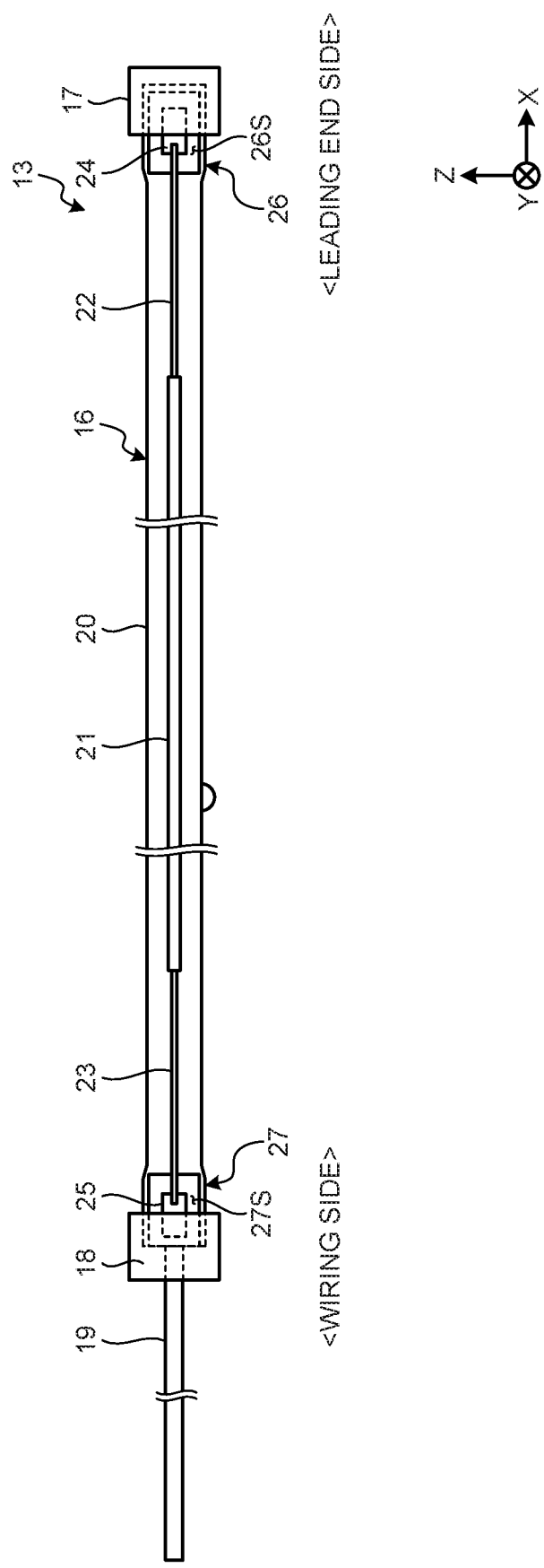
FIG. 5 is a side view illustrating a lamp heater according to the first embodiment.
Figure 6:
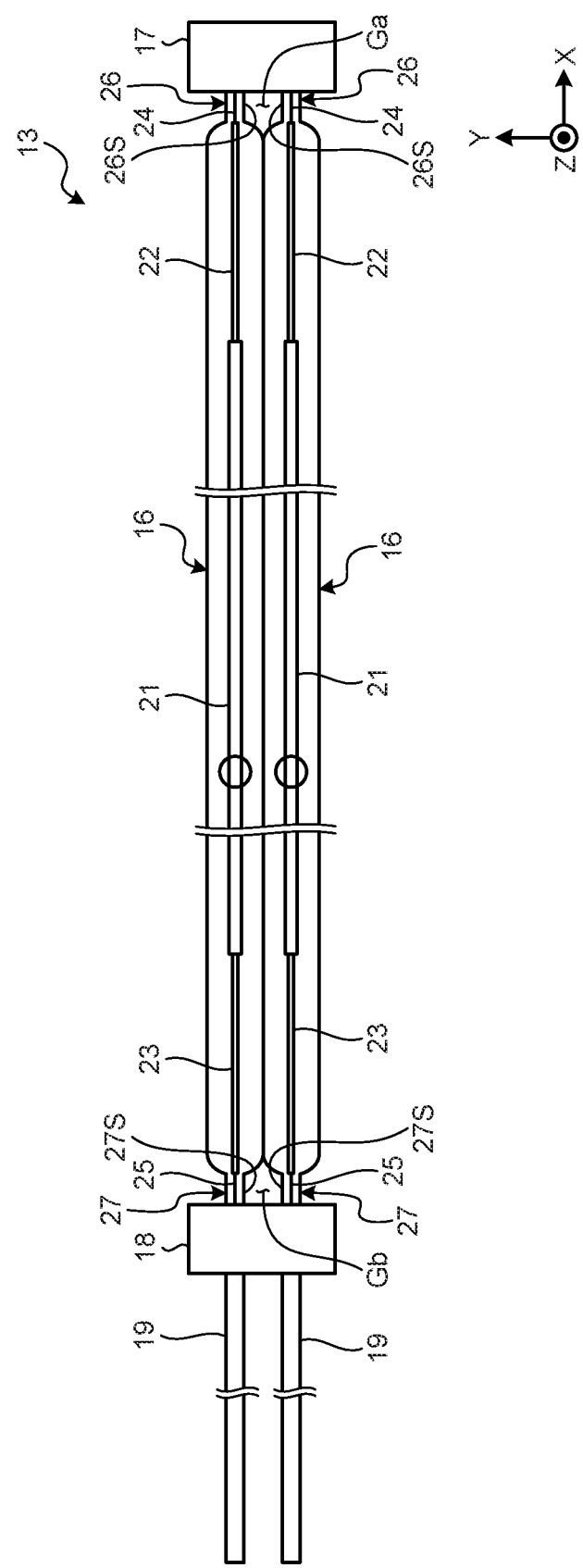
FIG. 6 is a top view illustrating the lamp heater according to the first embodiment.

FIG. 5 is a side view illustrating a lamp heater 13 according to the present embodiment. FIG. 6 is a top view illustrating the lamp heater 13 according to the present embodiment.

The lamp heater 13 includes two lamp bodies 16 arranged in parallel, a holding member 17 (first holding member) and a holding member 18 (second holding member) that hold the two lamp bodies 16, and external lead wires 19 connected to the lamp bodies 16.

Each of the lamp bodies 16 includes a sealed body 20, a filament 21, an internal lead wire 22 connected to one end (end on a +X side) of the filament 21, an internal lead wire 23 connected to the other end (end on a −X side) of the filament 21, metal foil 24 connected to the filament 21 via the internal lead wire 22, and metal foil 25 connected to the filament 21 via the internal lead wire 23.

One end (end on the +X side) of the lamp heater 13 is an end on a leading end side on which the external lead wire 19 is not arranged. The other end (end on the −X side) of the lamp heater 13 is an end on a wiring side on which the external lead wire 19 is arranged.

The sealed body 20 is a pipe member made of quartz glass. Light can pass through the sealed body 20. The sealed body 20 has an internal space. A sealing portion 26 (first sealing portion) is provided at one end (end on the +X side) of the sealed body 20. A sealing portion 27 (second sealing portion) is provided at the other end (end on the −X side) of the sealed body 20. The sealing portion 26 and the sealing portion 27 seal the internal space of the sealed body 20. The internal space of the sealed body 20 is filled with an inert gas and a halogen gas.

The filament 21 is arranged in the internal space of the sealed body 20. The filament 21 has a coil shape, for example. The filament 21 emits light and generates heat by energization. In the present embodiment, the filament 21 is made of tungsten.

The internal lead wire 22 and the internal lead wire 23 are arranged in the internal space of the sealed body 20. Each of the internal lead wire 22 and the internal lead wire 23 is made of tungsten. The internal lead wire 22 connects the filament 21 and the metal foil 24. The internal lead wire 23 connects the filament 21 and the metal foil 25.

The sealing portion 26 is provided at one end on the leading end side of each of the lamp bodies 16. The sealing portion 27 is provided at the other end on the wiring side of each of the lamp bodies 16. The sealing portion 26 seals the one end of the sealed body 20. The sealing portion 27 seals the other end of the sealed body 20. The sealing portion 26 is formed by pressure-bonding of the one end of the sealed body 20 in a heated state. Similarly, the sealing portion 27 is formed by pressure-bonding of the other end of the sealed body 20 in a heated state.

The sealed body 20 has a cylindrical shape. Each of the sealing portion 26 and the sealing portion 27 has a plate shape continuous with the sealed body 20. A surface 26S is formed on the sealing portion 26 by pressure-bonding of the one end of the sealed body 20. A surface 27S is formed on the sealing portion 27 by pressure-bonding of the other end of the sealed body 20. Each of the surface 26S and the surface 27S is a flat surface.

The surface 26S is a flat surface parallel to the XZ plane. As illustrated in FIG. 6, a surface 26S of one lamp body 16 and a surface 26S of the other lamp body 16 are parallel to each other. A gap Ga is provided between a sealing portion 26 of the one lamp body 16 and a sealing portion 26 of the other lamp body 16.

The surface 27S is a flat surface parallel to the XZ plane. As illustrated in FIG. 6, a surface 27S of the one lamp body 16 and a surface 27S of the other lamp body 16 are parallel to each other. A gap Gb is provided between a sealing portion 27 of the one lamp body 16 and a sealing portion 27 of the other lamp body 16.

The metal foil 24 is connected to the internal lead wire 22. The metal foil 24 is made of molybdenum. The metal foil 24 is arranged in the sealing portion 26 in such a manner as to be sandwiched by a part of the sealed body 20. By pressure-bonding of the one end of the sealed body 20 in a state in which the metal foil 24 is arranged at the one end of the internal space of the sealed body 20, the metal foil 24 is arranged in the sealing portion 26 in such a manner as to be sandwiched by the part of the sealed body 20. A surface of the metal foil 24 is parallel to the surface 26S.

The metal foil 25 is connected to the internal lead wire 23. The metal foil 25 is made of molybdenum. The metal foil 25 is arranged in the sealing portion 27 in such a manner as to be sandwiched by a part of the sealed body 20. By pressure-bonding of the other end of the sealed body 20 in a state in which the metal foil 25 is arranged at the other end of the internal space of the sealed body 20, the metal foil 25 is arranged in the sealing portion 27 in such a manner as to be sandwiched by the part of the sealed body 20. A surface of the metal foil 25 is parallel to the surface 27S.

Each of the two lamp bodies 16 has the sealed body 20, the filament 21, the internal lead wire 22, the internal lead wire 23, the metal foil 24, the metal foil 25, the sealing portion 26, and the sealing portion 27.

Each of the holding member 17 and the holding member 18 holds at least a part of each of the two lamp bodies 16 in such a manner as to maintain relative positions of the two lamp bodies 16. The two lamp bodies 16 are arranged in parallel. The holding member 17 holds at least a part of the sealing portion 26 of the one lamp body 16 and at least a part of the sealing portion 26 of the other lamp body 16. The holding member 18 holds at least a part of the sealing portion 27 of the one lamp body 16 and at least a part of the sealing portion 27 of the other lamp body 16. The holding member 17 and the holding member 18 are made of ceramics.

The holding member 17 holds a part on the +X side of the sealing portions 26. An end on the −X side of the metal foil 24 is arranged on the −X side of an end on the −X side of the holding member 17. That is, the holding member 17 holds a part of each of the sealing portions 26 in such a manner as not to cover the entire metal foil 24 but to cover a part including an end on the +X side of the metal foil 24. A part including the end on the −X side of the metal foil 24 appears outside the holding member 17.

On the leading end side of the lamp heater 13, metal foil 24 arranged in the sealing portion 26 of the one lamp body 16 and metal foil 24 arranged in the sealing portion 26 of the other lamp body 16 are connected via a connection lead wire (not illustrated). The pair of pieces of metal foil 24 can be energized via the connection lead wire. The connection lead wire connects an end on the +X side of the metal foil 24 in the one lamp body 16 and an end on the +X side of the metal foil 24 in the other lamp body 16.

The holding member 18 holds an end on the −X side of the sealing portion 27. An end on the +X side of the metal foil 25 is arranged on the +X side of an end on the +X side of the holding member 18. That is, the holding member 18 holds a part of the sealing portion 27 in such a manner as not to cover the entire metal foil 25 but to cover a part including an end on the −X side of the metal foil 25. A part including the end on the +X side of the metal foil 25 appears outside the holding member 18.

On the wiring side of the lamp heater 13, each of metal foil 25 arranged in the sealing portion 27 of the one lamp body 16 and metal foil 25 arranged in the sealing portion 27 of the other lamp body 16 is connected to the external lead wire 19. Two external lead wires 19 are provided in such a manner as to be respectively connected to the metal foil 25 in the one lamp body 16 and the metal foil 25 in the other lamp body 16. The external lead wires 19 are connected to the ends on the −X side of the metal foil 25.

Figure 7:
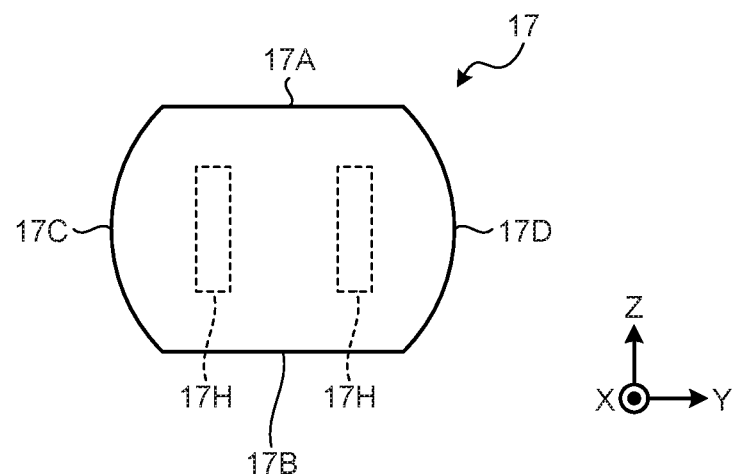
FIG. 7 is a front view illustrating a holding member according to the first embodiment.

FIG. 7 is a front view illustrating a holding member 17 according to the present embodiment. The holding member 17 has an upper surface 17A, a lower surface 17B, a side surface 17C, and a side surface 17D. The upper surface 17A is a flat surface parallel to an XY plane. The lower surface 17B is a flat surface parallel to the upper surface 17A. The side surface 17C connects one end of the upper surface 17A and one end of the lower surface 17B in a Y-axis direction. In a plane parallel to the YZ plane, the side surface 17C has a curved shape (arc shape) protruded in a −Y direction from a center of the holding member 17. The side surface 17D connects the other end of the upper surface 17A and the other end of the lower surface 17B in the Y-axis direction. In the plane parallel to the YZ plane, the side surface 17D has a curved shape (arc shape) protruding in a +Y direction from the center of the holding member 17.

The holding member 17 has bearing holes 17H in which the sealing portions 26 are arranged. The sealing portions 26 are inserted into the bearing holes 17H. The holding member 17 supports the sealing portions 26 on inner surfaces of the bearing holes 17H.

Figure 8:
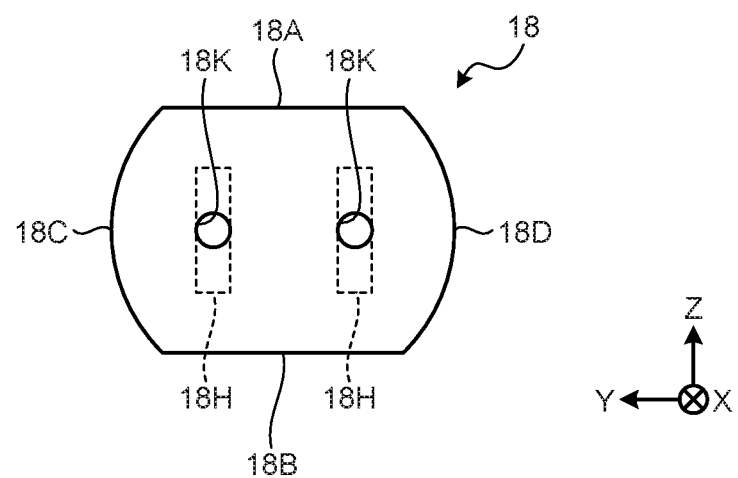
FIG. 8 is a front view illustrating the holding member according to the first embodiment.

FIG. 8 is a front view illustrating a holding member 18 according to the present embodiment. The holding member 18 has an upper surface 18A, a lower surface 18B, a side surface 18C, and a side surface 18D. Since an outer shape and dimensions of the holding member 18 are substantially the same as an outer shape and dimensions of the holding member 17, a description thereof will be omitted.

The holding member 18 has bearing holes 18H in which the sealing portions 27 are arranged, and bearing holes 18K in which external lead wires 19 are arranged. The sealing portions 27 are inserted into the bearing holes 18H. The external lead wires 19 are inserted into the bearing holes 18K. The holding member 18 supports the sealing portions 27 on inner surfaces of the bearing holes 18H. The holding member 18 supports the external lead wires 19 on inner surfaces of the bearing holes 18K.

One external lead wire 19 is connected to an anode of a power supply, and the other external lead wire 19 is connected to a cathode of the power supply. Current output from the power supply is supplied to a filament 21 in the one lamp body 16 via the one external lead wire 19 and the metal foil 25 in the one lamp body 16. The current flowing through the filament 21 in the one lamp body 16 is supplied to a filament 21 in the other lamp body 16 via the metal foil 24 in the one lamp body 16 and the metal foil 24 in the other lamp body 16. The current flowing through the filament 21 in the other lamp body 16 is output to the power supply via the metal foil 25 in the other lamp body 16 and the other external lead wire 19. When the current flows through the filament 21, the filament 21 emits light and generates heat.

[Container]

Figure 9:
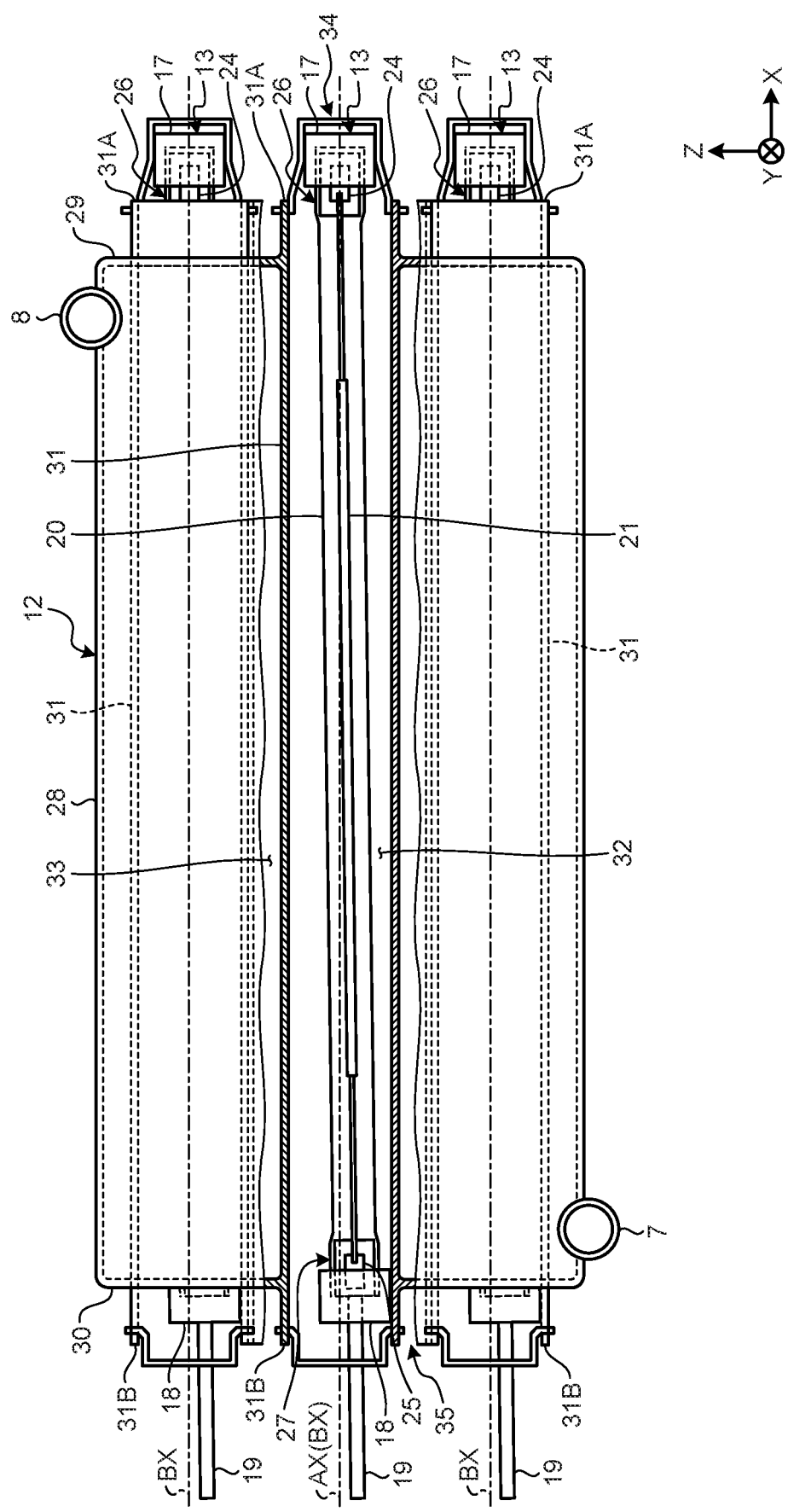
FIG. 9 is a side view illustrating a container according to the first embodiment.
Figure 10:
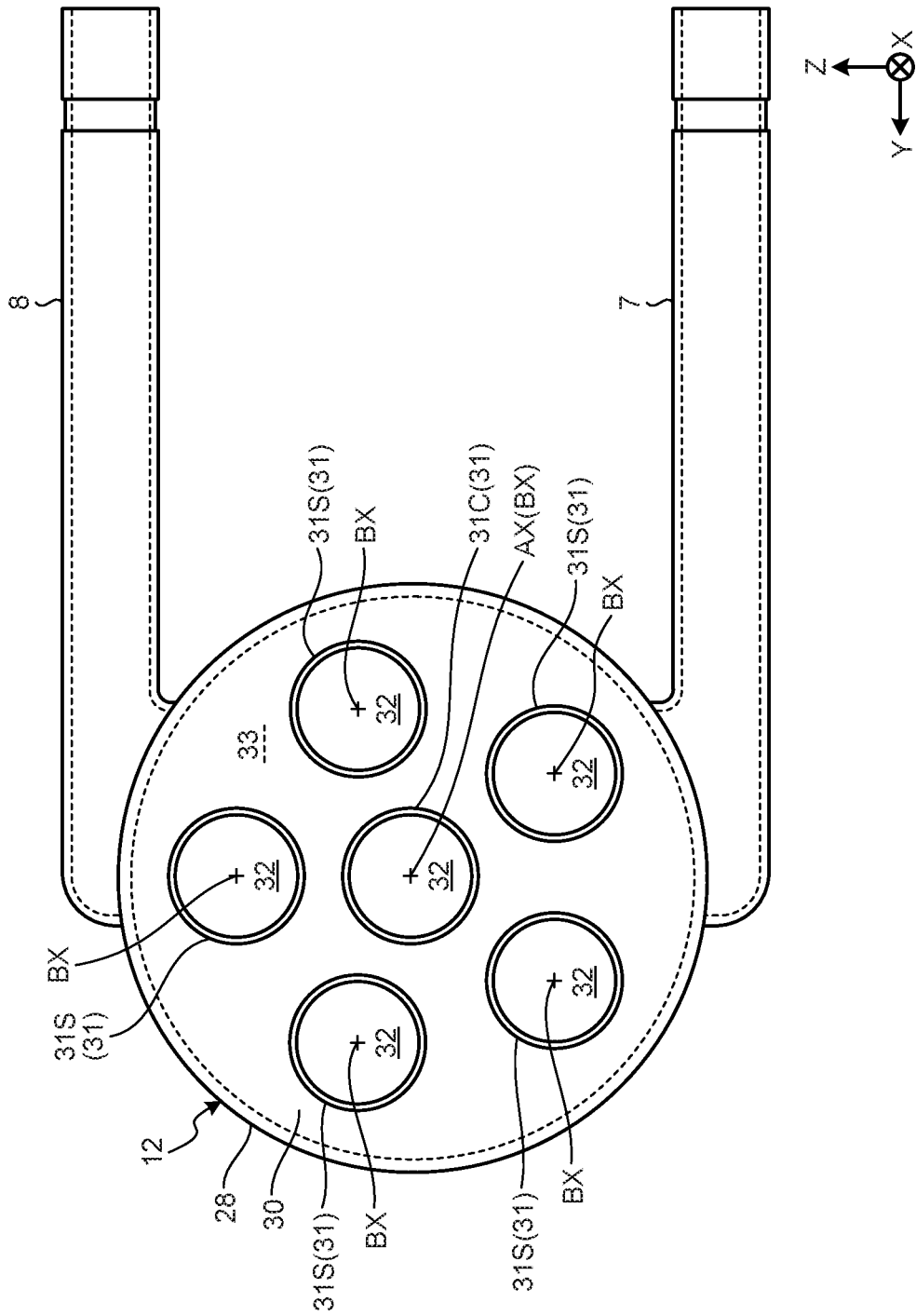
FIG. 10 is a front view illustrating the container according to the first embodiment.

FIG. 9 is a side view illustrating a container 12 according to the present embodiment, and is a partially broken sectional view. FIG. 10 is a front view illustrating the container 12 according to the present embodiment.

The container 12 includes an outer cylindrical member 28, a plate member 29 connected to one end (end on the +X side) of the outer cylindrical member 28, a plate member 30 connected to the other end (end on the −X side) of the outer cylindrical member 28, and a plurality of inner cylindrical members 31 arranged inside the outer cylindrical member 28.

The container 12 is formed of a transparent member. In the present embodiment, the container 12 is made of transparent quartz glass. That is, in the present embodiment, each of the outer cylindrical member 28, the plate member 29, the plate member 30, and the plurality of inner cylindrical members 31 is made of transparent quartz glass.

The outer cylindrical member 28 defines an outer surface of the container 12. The outer cylindrical member 28 has a cylindrical shape. The outer cylindrical member 28 is arranged around a central axis AX. The central axis AX of the container 12 is a central axis of the outer cylindrical member 28.

The plate member 29 is connected to an end on the +X side of the outer cylindrical member 28. The plate member 29 has a circular outer shape in a plane orthogonal to the central axis AX. The end on the +X side of the outer cylindrical member 28 and a peripheral edge of the plate member 29 are connected. The plate member 29 has a plurality of openings in which the plurality of inner cylindrical members 31 is respectively arranged.

The plate member 30 is connected to an end on the −X side of the outer cylindrical member 28. The plate member 30 has a circular outer shape in a plane orthogonal to the central axis AX. The end on the −X side of the outer cylindrical member 28 and a peripheral edge of the plate member 30 are connected. The plate member 30 has a plurality of openings in which the plurality of inner cylindrical members 31 is respectively arranged.

The plurality of inner cylindrical members 31 is arranged inside the outer cylindrical member 28. Each of the inner cylindrical members 31 has a cylindrical shape. The inner cylindrical members 31 are supported by the plate member 29 and the plate member 30 in such a manner that central axes BX of the inner cylindrical members 31 and the central axis AX of the outer cylindrical member 28 become parallel to each other. The central axes BX of the plurality of inner cylindrical members 31 are parallel to each other.

A part on the +X side of a center of each of the inner cylindrical members 31 in the X-axis direction is arranged in an opening in the plate member 29. Outer surfaces of the inner cylindrical members 31 and inner surfaces of the openings in the plate member 29 are connected. A part on the −X side of the center of each of the inner cylindrical members 31 in the X-axis direction is arranged in an opening in the plate member 30. The outer surfaces of the inner cylindrical members 31 and inner surfaces of the openings in the plate member 30 are connected.

One ends 31A (end on the +X side) of the inner cylindrical members 31 are protruded in the +X direction compared to the plate member 29. That is, the one ends 31A of the inner cylindrical members 31 are arranged on the +X side of a surface on the +X side of the plate member 29.

The other ends 31B (end on the −X side) of the inner cylindrical members 31 are protruded in the −X direction compared to the plate member 30. That is, the other ends 31B of the inner cylindrical members 31 are arranged on the −X side of a surface on the −X side of the plate member 30.

As illustrated in FIG. 10, the inner cylindrical members 31 include a central inner cylindrical member 31C arranged at the center of the outer cylindrical member 28 in a plane orthogonal to the central axis AX of the outer cylindrical member 28, and a plurality of peripheral inner cylindrical members 31S arranged around the central inner cylindrical member 31C. In the present embodiment, there are five peripheral inner cylindrical members 31S. That is, in the present embodiment, the total number of the inner cylindrical members 31 is six. The peripheral inner cylindrical members 31S are arranged at regular intervals around the central inner cylindrical member 31C.

In the present embodiment, the central inner cylindrical member 31C is arranged at the center of the outer cylindrical member 28 in the plane orthogonal to the central axis AX of the outer cylindrical member 28. A central axis BX of the central inner cylindrical member 31C and the central axis AX of the outer cylindrical member 28 coincide. Note that the central inner cylindrical member 31C may be arranged in a position deviated from the center of the outer cylindrical member 28. The central axis BX of the central inner cylindrical member 31C and the central axis AX of the outer cylindrical member 28 do not have to coincide.

The container 12 has lamp spaces 32 in which the lamp heaters 13 are arranged, and a fluid space 33 to which fluid to be heated is supplied.

The lamp spaces 32 are spaces inside the inner cylindrical members 31. The central lamp heater 13C is arranged in a lamp space 32 of the central inner cylindrical member 31C. The peripheral lamp heaters 13S are respectively arranged in lamp spaces 32 of the plurality of peripheral inner cylindrical members 31S.

The fluid space 33 is defined between an inner surface of the outer cylindrical member 28 and outer surfaces of the inner cylindrical members 31. In the present embodiment, the fluid space 33 is a space between the inner surface of the outer cylindrical member 28, an inner surface of the plate member 29, an inner surface of the plate member 30, and the outer surfaces of the inner cylindrical members 31. The second connecting pipe 7 is connected to a part on the −X side and a −Z side of the fluid space 33. A third connecting pipe 8 is connected to a part on the +X side and a +Z side of the fluid space 33. Fluid is supplied to the fluid space 33 through the second connecting pipe 7.

The lamp spaces 32 and the fluid space 33 are separated by the inner cylindrical member 31. The lamp heaters 13 arranged in the lamp spaces 32 do not come into contact with the fluid supplied to the fluid space 33.

When current is supplied to the lamp heaters 13 arranged in the lamp spaces 32, filaments 21 of the lamp heaters 13 emit light and generate heat. The light generated by the lamp heaters 13 is emitted to the fluid in the fluid space 33 through the inner cylindrical members 31, and the heat generated by the lamp heaters 13 is transferred to the fluid in the fluid space 33 through the inner cylindrical members 31. The fluid in the fluid space 33 is heated by radiant heat of the lamp heaters 13.

In the present embodiment, a plurality of (six) lamp spaces 32 is provided, and a lamp heater 13 is provided in each of the plurality of lamp spaces 32. The fluid in the fluid space 33 can receive the radiant heat of the lamp heaters 13 in a plurality of directions. Thus, even when a large amount of fluid is supplied to the fluid space 33, the fluid is efficiently heated.

The fluid heated in the fluid space 33 is delivered to the outside of the fluid space 33 through the third connecting pipe 8. As described with reference to FIG. 1, the heated fluid is supplied to the processing tank 2.

[Support Mechanism]

Next, support mechanisms of a lamp heater 13 according to the present embodiment will be described. A support mechanism 34 is arranged at an end on the +X side of an inner cylindrical member 31. A support mechanism 35 is arranged at an end on the −X side of the inner cylindrical member 31.

In the present embodiment, six lamp heaters 13 have the same dimensions, structure, and function. Six inner cylindrical members 31 have the same dimensions, structure, and function. The support mechanism 34 and the support mechanism 35 are provided in each of the six lamp heaters 13 and the six inner cylindrical members 31. The six support mechanisms 34 have the same dimensions, structure, and function. The six support mechanisms 35 have the same dimensions, structure, and function.

Figure 11:
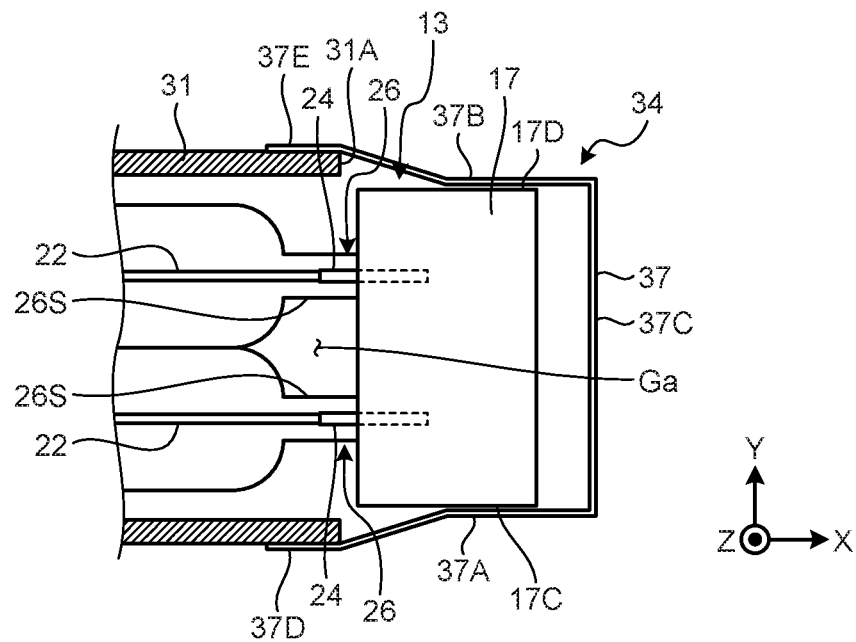
FIG. 11 is a cross-sectional view illustrating a support mechanism of the lamp heater according to the first embodiment.
Figure 12:
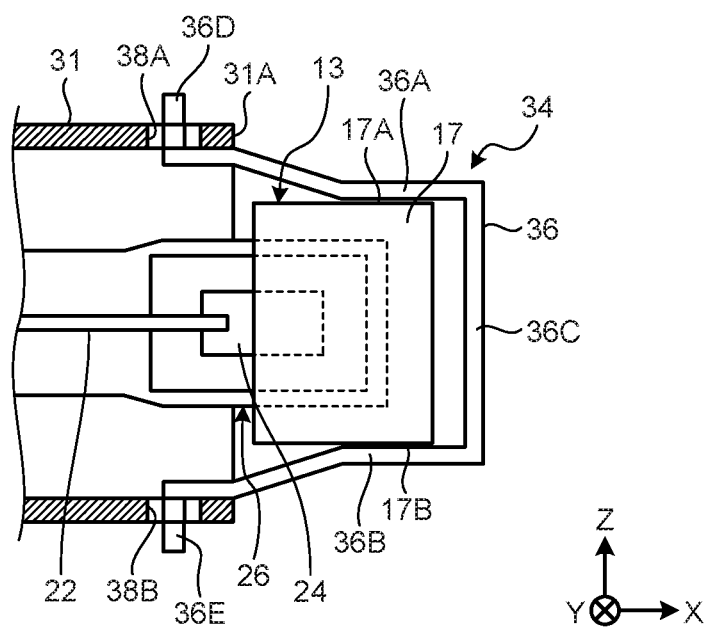
FIG. 12 is a cross-sectional view illustrating the support mechanism of the lamp heater according to the first embodiment.
Figure 13:
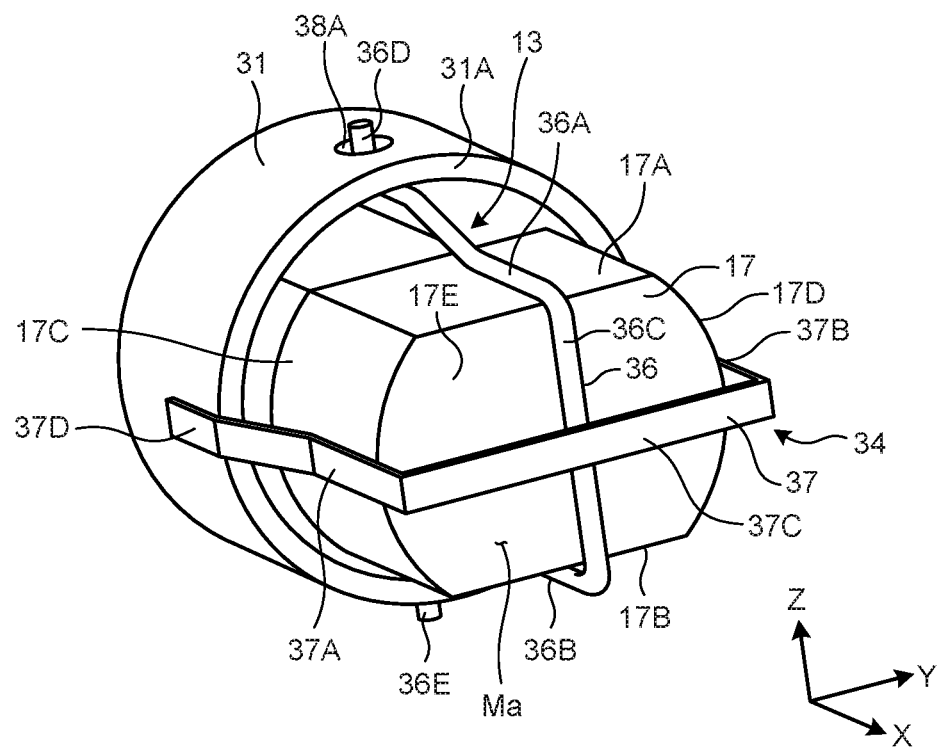
FIG. 13 is a perspective view illustrating the support mechanism of the lamp heater according to the first embodiment.

FIG. 11 is a cross-sectional view of a support mechanism 34 of a lamp heater 13 according to the present embodiment which mechanism is viewed from the +Z side. FIG. 12 is a cross-sectional view of the support mechanism 34 of the lamp heater 13 according to the present embodiment which mechanism is viewed from the −Y side. FIG. 13 is a perspective view illustrating the support mechanism 34 of the lamp heater 13 according to the present embodiment.

A part on a leading end side of the lamp heater 13 is supported by an inner cylindrical member 31 via the support mechanism 34. In the present embodiment, the part on the leading end side of the lamp heater 13 is protruded to the +X side compared to one end 31A of the inner cylindrical member 31. The support mechanism 34 supports at least a part of the lamp heater 13 in a state in which the part on the leading end side of the lamp heater 13 is arranged outside the inner cylindrical member 31.

Each of a part on the leading end side of a central lamp heater 13C and a part on the leading end side of a peripheral lamp heater 13C is arranged outside the one end 31A of the inner cylindrical member 31.

The part on the leading end side of the lamp heater 13 which part is arranged outside the inner cylindrical member 31 includes one end on the +X side of the lamp heater 13. In the present embodiment, the part of the leading end side of the lamp heater 13 which part is arranged outside the inner cylindrical member 31 includes a sealing portion 26 and a holding member 17 of the lamp heater 13. The support mechanism 34 supports the holding member 17 in a state in which the sealing portion 26 and the holding member 17 of the lamp heater 13 are arranged outside the inner cylindrical member 31.

That is, in the present embodiment, the holding member 17 is arranged on the +X side of the one end 31A of the inner cylindrical member 31. Also, at least a part of metal foil 24 of the sealing portion 26 is arranged on the +X side of the one end 31A of the inner cylindrical member 31. The support mechanism 34 supports the lamp heater 13 in such a manner that at least a part of the holding member 17 and the metal foil 24 of the sealing portion 26 are arranged outside the inner cylindrical member 31.

The support mechanism 34 has a first support member 36 that limits movement of the holding member 17 in the Z-axis direction and a second support member 37 that limits movement of the holding member 17 in the Y-axis direction.

The first support member 36 is a metallic wire-shaped (round bar-shaped) member. The first support member 36 is elastically deformable. The first support member 36 includes a first contact portion 36A that makes contact with an upper surface 17A of the holding member 17, a second contact portion 36B that makes contact with a lower surface 17B of the holding member 17, a coupling portion 36C that couples the first contact portion 36A and the second contact portion 36B, a first insertion portion 36D coupled to the first contact portion 36A, and a second insertion portion 36E coupled to the second contact portion 36B.

The coupling portion 36C faces an end surface 17E on the +X side of the holding member 17. The first insertion portion 36D is inserted into a first through hole 38A provided in an upper part of the inner cylindrical member 31. The second insertion portion 36E is inserted into a second through hole 38B provided in a lower part of the inner cylindrical member 31. The first insertion portion 36D has a protrusion that can be inserted into the first through hole 38A. The second insertion portion 36E has a protrusion that can be inserted into the second through hole 38B. The first through hole 38A pierces through an outer surface and an inner surface of the inner cylindrical member 31 in the upper part of the inner cylindrical member 31 on the +X side of a plate member 29. The second through hole 38B pierces through the outer surface and the inner surface of the inner cylindrical member 31 in the lower part of the inner cylindrical member 31 on the +X side of the plate member 29. The first insertion portion 36D is inserted into the first through hole 38A from the inside of the inner cylindrical member 31. The second insertion portion 36E is inserted into the second through hole 38B from the inside of the inner cylindrical member 31.

The second support member 37 is a metallic thin plate member. The second support member 37 is elastically deformable. The second support member 37 includes a third contact portion 37A that makes contact with a side surface 17C of the holding member 17, a fourth contact portion 37B that makes contact with a side surface 17D of the holding member 17, a coupling portion 37C that couples the third contact portion 37A and the fourth contact portion 37B, and a holding portion 37D and a holding portion 37E that hold the inner cylindrical member 31 therebetween.

The coupling portion 37C faces the end surface 17E on the +X side of the holding member 17. The holding portion 37D makes contact with an outer surface on the −Y side of the inner cylindrical member 31. The holding portion 37E makes contact with an outer surface on the +Y side of the inner cylindrical member 31. By an elastic deformation of the second support member 37, the holding portion 37D and the holding portion 37E sandwich the inner cylindrical member 31.

In the present embodiment, the holding member 17 is supported by the first support member 36 and the second support member 37. An opening Ma is provided between the first support member 36 and the second support member 37. In the opening Ma, the holding member 17 and the sealing portion 26 are not covered with the support mechanism 34. At least a part of the holding member 17 and at least a part of the sealing portion 26 face an internal space of a case 11 through the opening Ma.

Also, an outer shape of the holding member 17 is smaller than an inner diameter of the inner cylindrical member 31 in a plane orthogonal to a central axis BX. A sufficient gap is provided between the upper surface 17A of the holding member 17 and the inner surface of the inner cylindrical member 31. A sufficient gap is provided between the lower surface 17B of the holding member 17 and the inner surface of the inner cylindrical member 31.

Figure 14:
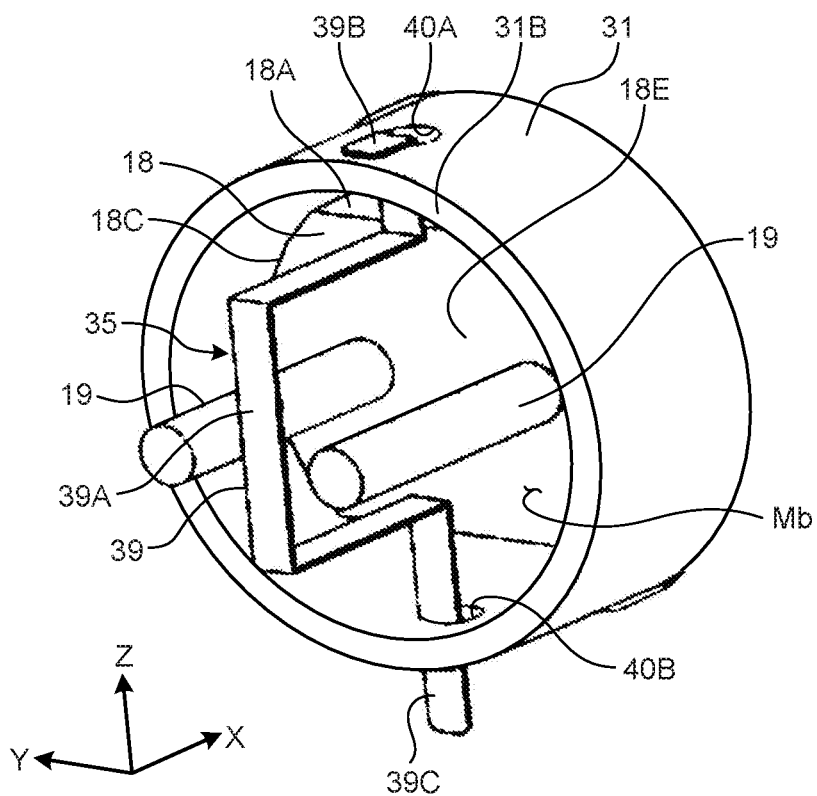
FIG. 14 is a perspective view illustrating the support mechanism of the lamp heater according to the first embodiment.

FIG. 14 is a perspective view illustrating a support mechanism 35 of the lamp heater 13 according to the present embodiment. A part on the wiring side of the lamp heater 13 is arranged on the +X side of the other end 31B of the inner cylindrical member 31. The part on the wiring side of the lamp heater 13 which part is arranged inside the inner cylindrical member 31 includes one end on the −X side of the lamp heater 13. In the present embodiment, the part on the wiring side of the lamp heater 13 which part is arranged inside the inner cylindrical member 31 includes a sealing portion 27 and a holding member 18 of the lamp heater 13. That is, the sealing portion 27 and the holding member 18 are arranged inside the inner cylindrical member 31. The support mechanism 35 controls protrusion of the lamp heater 13 to the outside from the other end 31B of the inner cylindrical member 31.

The support mechanism 35 includes a support member 39 facing an end surface 18E on the −X side of the holding member 18. The support member 39 is a metallic thin plate member. The support member 39 is elastically deformable. The support member 39 includes an insertion portion 39B inserted into a through hole 40A provided in the upper part of the inner cylindrical member 31, an insertion portion 39C inserted into a through hole 40B provided in the lower part of the inner cylindrical member 31, and a coupling portion 39A that couples the insertion portion 39B and the insertion portion 39C.

The coupling portion 39A faces the end surface 18E on the −X side of the holding member 18. The through hole 40A pierces through the outer surface and the inner surface of the inner cylindrical member 31 in the upper part of the inner cylindrical member 31 on the −X side of a plate member 30. The through hole 40B pierces through the outer surface and the inner surface of the inner cylindrical member 31 in the lower part of the inner cylindrical member 31 on the −X side of the plate member 30. The insertion portion 39B has a protrusion that can be inserted into the through hole 40A. The insertion portion 39C has a protrusion that can be inserted into the through hole 40B. The insertion portion 39B is inserted into the through hole 40A from the inside of the inner cylindrical member 31. The insertion portion 39C is inserted into the through hole 40B from the inside of the inner cylindrical member 31.

In the present embodiment, the support member 39 limits movement of the holding member 18 to the outside of the inner cylindrical member 31. An opening Mb is provided around the support member 39. The holding member 18 and the sealing portion 27 are not covered by the support mechanism 35 in the opening Mb. At least a part of the holding member 18 and at least a part of the sealing portion 27 face the internal space of the case 11 through the opening Mb.

As described above, six lamp heaters 13, six inner cylindrical members 31, six support mechanisms 34, and six support mechanisms 35 respectively have the same dimensions, structures, and functions. In the present embodiment, the plurality of lamp heaters 13 are respectively arranged in the inner cylindrical members 31 in such a manner that postures of the inner cylindrical members 31 in a rotation direction of the central axes BX are coincident. That is, the plurality of lamp heaters 13 is respectively fixed to the inner cylindrical members 31 in such a manner that the upper surfaces 17A and the lower surfaces 17B that are flat surfaces of the holding member 17 are vertical when viewed in a horizontal direction. For example, as illustrated in FIG. 11, the plurality of lamp heaters 13 is respectively supported by the support mechanisms 34 in such a manner that surfaces 26S of sealing portions 26 and an XZ plane become parallel to each other.

Also, as described with reference to FIG. 3 and the like, the container holding mechanism 15 holds the container 12 in such a manner that the central axis AX of the outer cylindrical member 28 is inclined in the +Z direction toward the +X direction. As described above, the central axis AX of the outer cylindrical member 28 and the central axes BX of the inner cylindrical members 31 are parallel to each other. That is, the container holding mechanism 15 holds the container 12 in such a manner that one ends 31A (end on the +X side or end on the leading end side) of the inner cylindrical members 31 are arranged above the other ends 31B (end on the −X side or end on the wiring side) of the inner cylindrical members 31. At the one ends 31A of the inner cylindrical members 31, ends on the leading end side of the lamp heaters 13 which ends include the sealing portions 26 are arranged. At the other ends 31B of the inner cylindrical members 31, ends on the wiring side of the lamp heaters 13 which ends include the sealing portions 27 are arranged. In a state in which the lamp heaters 13 are arranged in the inner cylindrical members 31, the ends on the leading end side of the lamp heaters 13 which ends include the sealing portions 26 are arranged above the ends on the wiring side the lamp heaters 13 which ends include the sealing portions 27.

[Cooling Device]

The fluid heating device 4 includes a cooling device 50 that cools the lamp heaters 13. The cooling device 50 supplies gas to the lamp heaters 13 and cools the lamp heaters 13.

Figure 15:
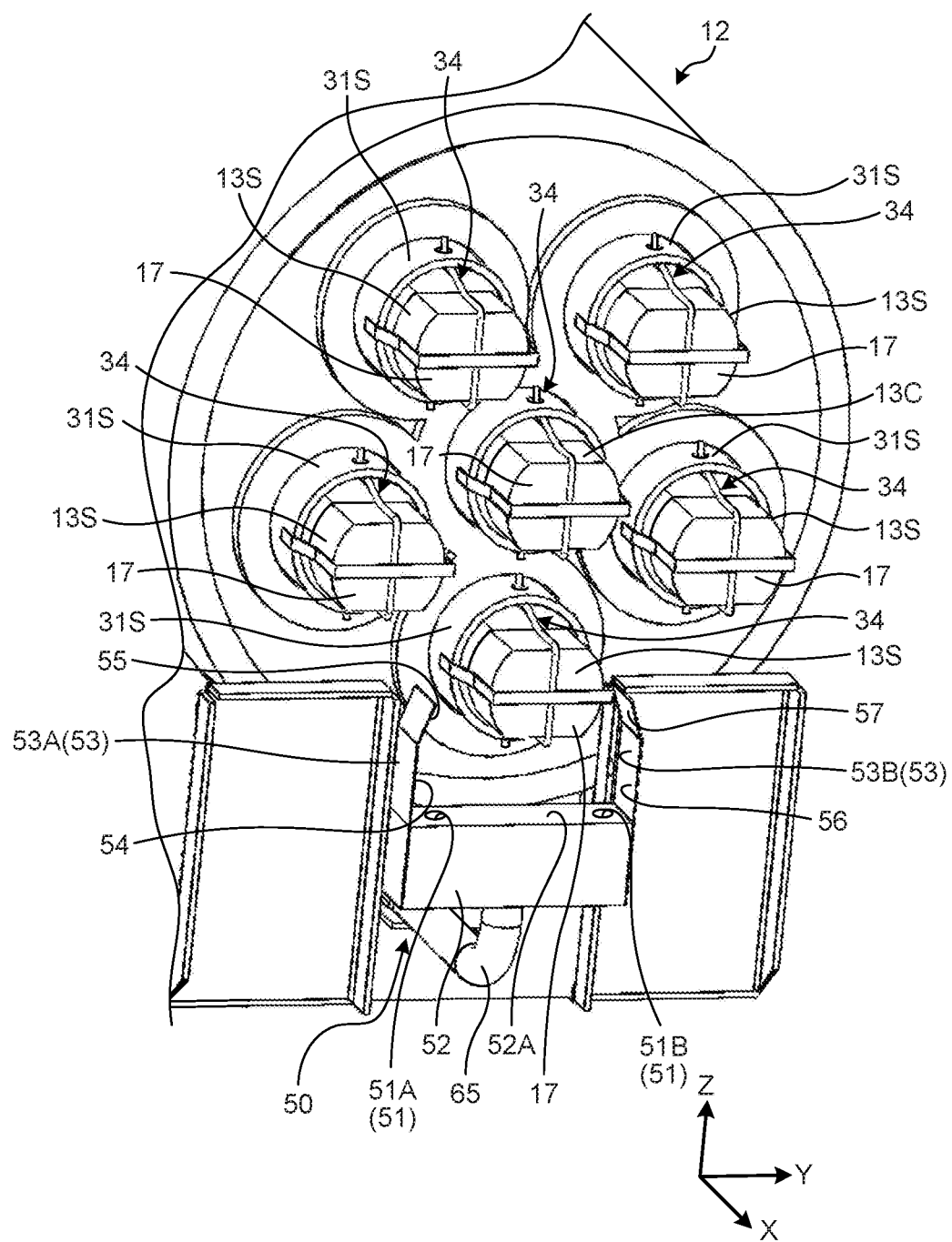
FIG. 15 is a perspective view illustrating a cooling device according to the first embodiment.
Figure 16:
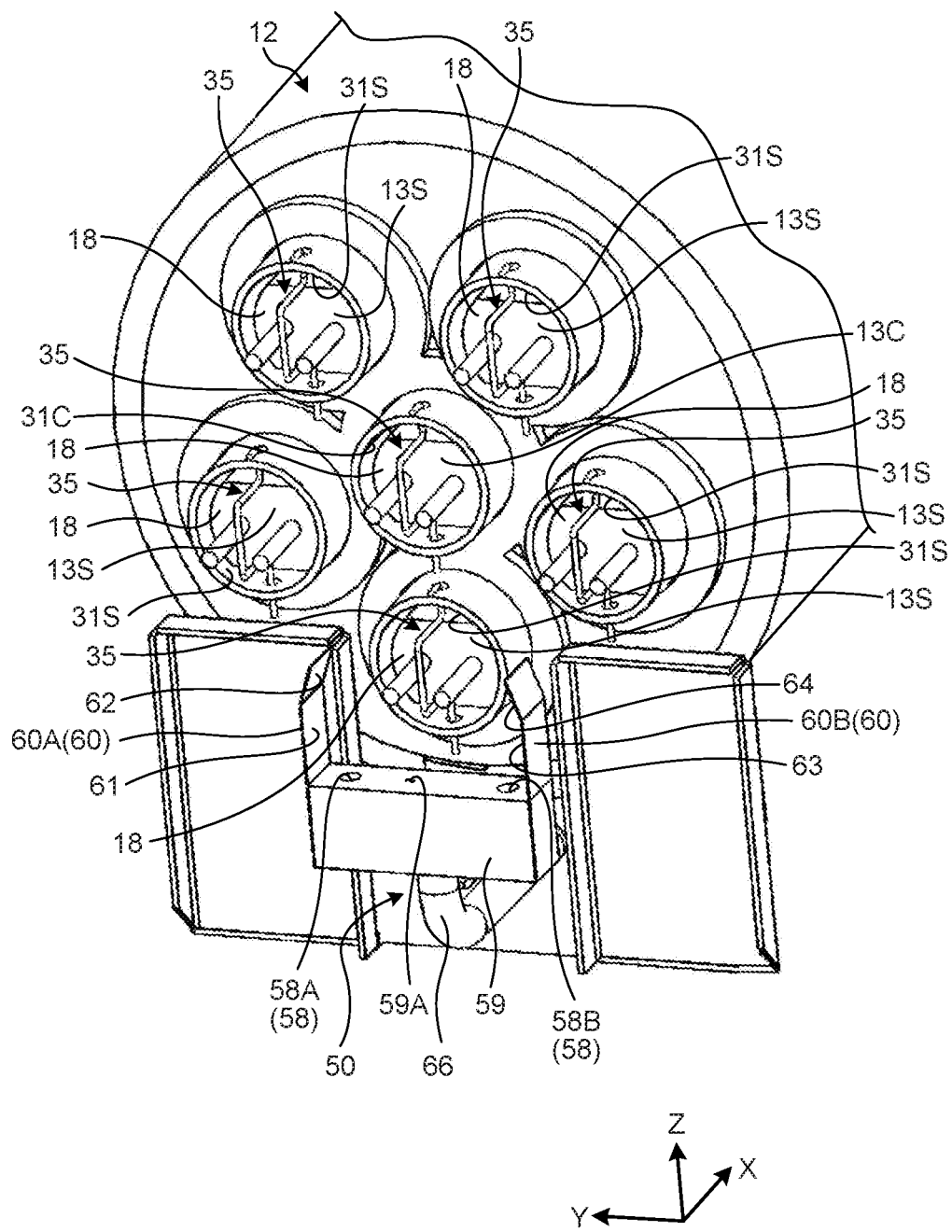
FIG. 16 is a perspective view illustrating the cooling device according to the first embodiment.

FIG. 15 and FIG. 16 are perspective views illustrating the cooling device 50 according to the present embodiment. FIG. 15 is a view illustrating at least a part of the cooling device 50 which part cools a leading end side of the lamp heaters 13 which side includes ends on the +X side of the lamp heaters 13. FIG. 16 is a view illustrating at least a part of the cooling device 50 which part cools a wiring side of the lamp heaters 13 which side includes ends on the −X side of the lamp heaters 13.

As illustrated in FIG. 15, the cooling device 50 includes a nozzle member 52 (first nozzle member) that is arranged on the leading end side of the lamp heaters 13 and that has an air supply port 51, and a guide mechanism 53 (first guide mechanism) that guides gas (first gas) supplied from the air supply port 51 of the nozzle member 52 to the leading end side of the lamp heaters 13. The gas supplied from the air supply port 51 is, for example, air.

The nozzle member 52 is arranged on the leading end side of the lamp heaters 13 (see FIG. 5). The air supply port 51 of the nozzle member 52 supplies the gas to the leading end side of the lamp heaters 13. The guide mechanism 53 guides the gas on the leading end side of the lamp heaters 13.

The guide mechanism 53 guides the gas supplied from the air supply port 51 to a leading end side of a central lamp heater 13C.

The air supply port 51 supplies the gas to cool the leading end side of the central lamp heater 13C which side includes an end on the +X side of the central lamp heater 13C. The guide mechanism 53 guides the gas to a sealing portion 26 and a holding member 17 that are on the leading end side of the central lamp heater 13C and that are arranged outside on the +X side of one end 31A of a central inner cylindrical member 31C. The gas supplied from the air supply port 51 is guided by the guide mechanism 53 and supplied to the sealing portion 26 and the holding member 17 of the central lamp heater 13C.

The nozzle member 52 is arranged below the plurality of inner cylindrical members 31 at an end on the +X side of the container 12. The air supply port 51 is provided in an upper surface 52A of the nozzle member 52. Two air supply ports 51 are provided in the Y-axis direction. The air supply ports 51 include an air supply port 51A arranged on the −Y side of a central axis AX of the outer cylindrical member 28 in the Y-axis direction, and an air supply port 51B arranged on the +Y side. A distance between the air supply port 51A and the air supply port 51B in the Y-axis direction is longer than a dimension of the inner cylindrical member 31.

In the Y-axis direction, a position of the central inner cylindrical member 31C and a position of a peripheral inner cylindrical member 31S immediately below the central inner cylindrical member 31C are equal. In the Y-axis direction, a position of the central lamp heater 13C and a position of a peripheral lamp heater 13S immediately below the central lamp heater 13C are equal.

In the Y-axis direction, the air supply port 51A is arranged on the −Y side of the peripheral inner cylindrical member 31S immediately below the central inner cylindrical member 31C. In the Y-axis direction, the air supply port 51B is arranged on the +Y side of the peripheral inner cylindrical member 31S immediately below the central inner cylindrical member 31C. Each of the air supply port 51A and the air supply port 51B supplies gas in the +Z direction.

The guide mechanism 53 includes a guide member 53A that guides the gas supplied from the air supply port 51A to the central lamp heater 13C, and a guide member 53B that guides the gas supplied from the air supply port 51B to the central lamp heater 13C.

The guide member 53A is supported by a side surface on the −Y side of the nozzle member 52. A lower end of the guide member 53A is fixed to the side surface on the −Y side of the nozzle member 52.

The guide member 53B is supported by a side surface on the +Y side of the nozzle member 52. A lower end of the guide member 53B is fixed to the side surface on the +Y side of the nozzle member 52.

The guide member 53A is arranged on the −Y side of the air supply port 51A. In the Z-axis direction, the guide member 53A includes a guide surface 54 arranged between the upper surface 52A of the nozzle member 52 and at least a part of the peripheral inner cylindrical member 31S immediately below the central inner cylindrical member 31C, and a guide surface 55 that is arranged above the guide surface 54 and inclined in the +Y direction toward the +Z direction.

The guide surface 54 is substantially parallel to the XZ plane. In the Z-axis direction, a position of an upper end of the guide surface 54 and a position of at least the part of the peripheral inner cylindrical member 31S immediately below the central inner cylindrical member 31C coincide. The guide surface 55 has a lower end connected to the upper end of the guide surface 54, and an upper end. In the Y-axis direction, the upper end of the guide surface 55 is closer to the central lamp heater 13C than the lower end of the guide surface 55. The guide surface 55 is inclined in such a manner as to become closer to the central lamp heater 13C in the +Z direction.

The guide member 53B is arranged on the +Y side of the air supply port 51B. In the Z-axis direction, the guide member 53B includes a guide surface 56 arranged between the upper surface 52A of the nozzle member 52 and at least a part of the peripheral inner cylindrical member 31S immediately below the central inner cylindrical member 31C, and a guide surface 57 that is arranged above the guide surface 56 and inclined in the −Y direction toward the +Z direction.

The guide surface 56 is substantially parallel to the XZ plane. In the Z-axis direction, a position of an upper end of the guide surface 56 and a position of at least the part of the peripheral inner cylindrical member 31S immediately below the central inner cylindrical member 31C coincide. The guide surface 57 has a lower end connected to the upper end of the guide surface 56, and an upper end. In the Y-axis direction, the upper end of the guide surface 57 is closer to the central lamp heater 13C than the lower end of the guide surface 57. The guide surface 57 is inclined in such a manner as to become closer to the central lamp heater 13C in the +Z direction.

By the gas (first gas) guided by the guide mechanism 53, the leading end side of the central lamp heater 13C is cooled more intensively than the leading end side of the peripheral lamp heater 13S.

As illustrated in FIG. 16, the cooling device 50 includes a nozzle member 59 (second nozzle member) that is arranged on the wiring side of the lamp heaters 13 and that has an air supply port 58, and a guide mechanism 60 (second guide mechanism) that guides gas (second gas) supplied from the air supply port 58 of the nozzle member 59 to the wiring side of the lamp heaters 13. The gas supplied from the air supply port 58 is, for example, air.

The nozzle member 59 is arranged on the wiring side of the lamp heaters 13 (see FIG. 5). The air supply port 58 of the nozzle member 59 supplies the gas to the wiring side of the lamp heaters 13. The guide mechanism 60 guides the gas on the wiring side of the lamp heaters 13.

The guide mechanism 60 guides the gas supplied from the air supply port 58 to the wiring side of the central lamp heater 13C.

The air supply port 58 supplies the gas to cool the wiring side of the central lamp heater 13C which side includes an end on the −X side of the central lamp heater 13C. The guide mechanism 60 guides the gas to a sealing portion 27 and a holding member 18 that are on the wiring side of the central lamp heater 13C and are arranged inside on the +X side of the other end 31B of the central inner cylindrical member 31C. The gas supplied from the air supply port 58 is guided by the guide mechanism 60 and supplied to the sealing portion 27 and the holding member 18 of the central lamp heater 13C.

The nozzle member 59 is arranged below the plurality of inner cylindrical members 31 at an end on the −X side of a container 12. The air supply port 58 is provided in an upper surface 59A of the nozzle member 59. Two air supply ports 58 are provided in the Y-axis direction. The air supply ports 58 include an air supply port 58A arranged on the +Y side of the central axis AX of the outer cylindrical member 28 in the Y-axis direction, and an air supply port 58B arranged on the −Y side. In the Y-axis direction, a distance between the air supply port 58A and the air supply port 58B is longer than a dimension of each of the inner cylindrical members 31.

In the Y-axis direction, a position of the central inner cylindrical member 31C and a position of the peripheral inner cylindrical member 31S immediately below the central inner cylindrical member 31C are equal. In the Y-axis direction, a position of the central lamp heater 13C and a position of the peripheral lamp heater 13S immediately below the central lamp heater 13C are equal.

In the Y-axis direction, the air supply port 58A is arranged on the +X side of the peripheral inner cylindrical member 31S immediately below the central inner cylindrical member 31C. In the Y-axis direction, the air supply port 58B is arranged on the −X side of the peripheral inner cylindrical member 31S immediately below the central inner cylindrical member 31C. Each of the air supply port 58A and the air supply port 58B supplies gas in the +Z direction.

The guide mechanism 60 includes a guide member 60A that guides the gas supplied from the air supply port 58A to the central lamp heater 13C, and a guide member 60B that guides the gas supplied from the air supply port 58B to the central lamp heater 13C.

The guide member 60A is supported by a side surface on the +Y side of the nozzle member 59. A lower end of the guide member 60A is fixed to the side surface on the +Y side of the nozzle member 59.

The guide member 60B is supported by a side surface on the −Y side of the nozzle member 59. A lower end of the guide member 60B is fixed to the side surface on the −Y side of the nozzle member 59.

The guide member 60A is arranged on the +Y side of the air supply port 58A. In the Z-axis direction, the guide member 60A includes a guide surface 61 arranged between the upper surface 59A of the nozzle member 59 and at least a part of the peripheral inner cylindrical member 31S immediately below the central inner cylindrical member 31C, and a guide surface 62 that is arranged above the guide surface 61 and inclined in the −Y direction toward the +Z direction.

The guide surface 61 is substantially parallel to the XZ plane. In the Z-axis direction, a position of an upper end of the guide surface 61 and a position of at least part of the peripheral inner cylindrical member 31S immediately below the central inner cylindrical member 31C coincide. The guide surface 62 has a lower end connected to the upper end of the guide surface 61, and an upper end. In the Y-axis direction, the upper end of the guide surface 62 is closer to the central lamp heater 13C than the lower end of the guide surface 62. The guide surface 62 is inclined in such a manner as to become closer to the central lamp heater 13C in the +Z direction.

The guide member 60B is arranged on the −Y side of the air supply port 58B. In the Z-axis direction, the guide member 60B includes a guide surface 63 arranged between the upper surface 59A of the nozzle member 59 and at least a part of the peripheral inner cylindrical member 31S immediately below the central inner cylindrical member 31C, and a guide surface 64 that is arranged above the guide surface 63 and inclined in the +Y direction toward the +Z direction.

The guide surface 63 is substantially parallel to the XZ plane. In the Z-axis direction, a position of an upper end of the guide surface 63 and a position of at least the part of the peripheral inner cylindrical member 31S immediately below the central inner cylindrical member 31C coincide. The guide surface 64 has a lower end connected to the upper end of the guide surface 63, and an upper end. In the Y-axis direction, the upper end of the guide surface 64 is closer to the central lamp heater 13C than the lower end of the guide surface 64. The guide surface 64 is inclined in such a manner as to become closer to the central lamp heater 13C in the +Z direction.

By the gas (second gas) guided by the guide mechanism 60, the wiring side of the central lamp heater 13C is cooled more intensively than the wiring side of the peripheral lamp heaters 13S.

In the present embodiment, a flow rate of the gas (first gas) supplied from the air supply port 51 of the nozzle member 52 per unit time is higher than a flow rate of the gas (second gas) supplied from the air supply port 58 of the nozzle member 59 per unit.

As illustrated in FIG. 15, the nozzle member 52 is connected to a first supply pipe 65. As illustrated in FIG. 16, the nozzle member 59 is connected to a second supply pipe 66. As illustrated in FIG. 3 and FIG. 4, the first supply pipe 65 and the second supply pipe 66 are connected to a gas supply source 68 via a gas supply pipe 67. The gas delivered from the gas supply source 68 flows through the gas supply pipe 67 and then distributed to each of the first supply pipe 65 and the second supply pipe 66. The gas distributed to the first supply pipe 65 is supplied to the nozzle member 52, and is supplied from the air supply port 51 to the leading end side of the central lamp heater 13C. The gas distributed to the second supply pipe 66 is supplied to the nozzle member 59, and is supplied from the air supply port 58 to the wiring side of the central lamp heater 13C.

In the present embodiment, a flow rate of the gas distributed to the first supply pipe 65 is higher than a flow rate of the gas distributed to the second supply pipe 66. In the present embodiment, a baffle is arranged in the second supply pipe 66. By provision of a baffle in the second supply pipe 66, the gas delivered from the gas supply source 68 is distributed to the first supply pipe 65 and the second supply pipe 66 in such a manner that the flow rate of the gas flowing in the first supply pipe 65 is higher than the flow rate of the gas flowing in the second supply pipe 66.

[Operation]

Figure 17:
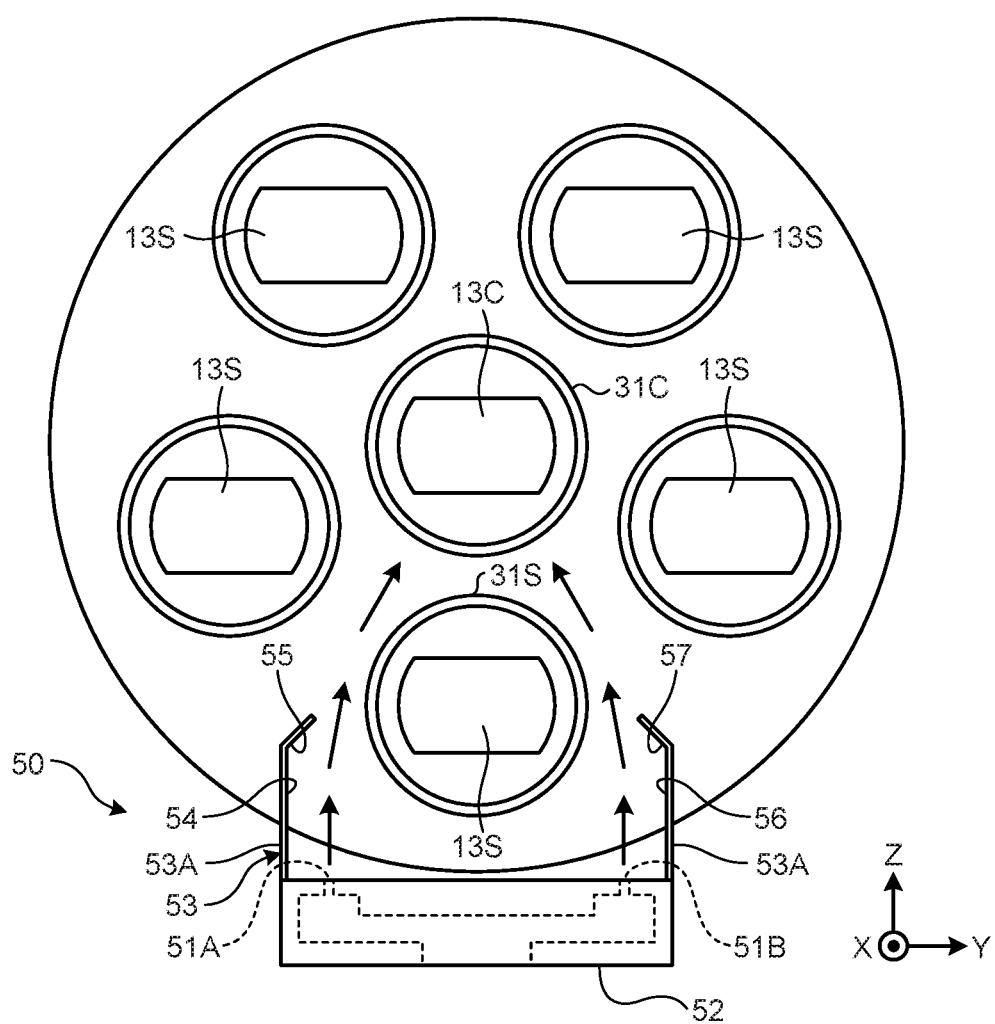
FIG. 17 is a schematic view for describing an operation of the cooling device according to the first embodiment.

FIG. 17 is a schematic view for describing operation of a cooling device 50 according to the present embodiment. Fluid (chemical solution) is supplied to a fluid space 33 through a second connecting pipe 7 in order to heat the fluid. Also, current is supplied to each of a plurality of lamp heaters 13 arranged in inner cylindrical members 31. When the current is supplied to the lamp heaters 13, the lamp heaters 13 emit light and generate heat. When the lamp heaters 13 emit light and generate heat, the fluid in the fluid space 33 is heated by radiant heat of the lamp heaters 13. The heated fluid is delivered from the fluid space 33 to a third connecting pipe 8.

When temperatures of sealing portions 26 and sealing portions 27 rise excessively, metal foil 24 and metal foil 25 are thermally expanded. As a result, sealing functions of the sealing portions 26 and the sealing portions 27 are impaired. When the sealing functions of the sealing portions 26 and the sealing portions 27 are impaired, performance of the lamp heaters 13 is degraded.

The sealing portions 26 are easily heated compared to the sealing portions 27. That is, since the sealing portions 27 are connected to external lead wires 19, heat of the sealing portions 27 is likely to be radiated through the external lead wires 19. Since the sealing portions 26 are not connected to the external lead wires 19, there is a high possibility that the temperature rises excessively.

In the present embodiment, parts on the leading end side of the lamp heaters 13 which parts include the sealing portions 26 are arranged outside the inner cylindrical members 31. As a result, the heat of the sealing portions 26 is released to an internal space of the case 11 without staying in the inner cylindrical members 31. Thus, the excessive temperature rise in the sealing portions 26 is controlled.

The central lamp heater 13C is surrounded by the plurality of peripheral lamp heaters 13S. Thus, even when a current value supplied to the central lamp heater 13C is equal to a current value supplied to the peripheral lamp heaters 13S, the central lamp heater 13C is more likely to have an excessive temperature rise than the peripheral lamp heaters 13S.

In the present embodiment, a cooling device 50 that supplies gas to a sealing portion 26 of the central lamp heater 13C is provided. As illustrated in FIG. 17, the gas supplied from an air supply port 51 of a nozzle member 52 is guided by a guide mechanism 53 and supplied to the sealing portion 26 of the central lamp heater 13C after passing through a space between a guide member 53A and a guide member 53B and a peripheral inner cylindrical member 31S immediately below the central inner cylindrical member 31C. The sealing portion 26 of the central lamp heater 13C is cooled by the gas supplied from the air supply port 51. As a result, the excessive temperature rise in the sealing portion 26 of the central lamp heater 13C is controlled.

In the present embodiment, the gas guided by the guide mechanism 53 cools the leading end side of the central lamp heater 13C more intensively than the leading end side of the peripheral lamp heaters 13S.

As described with reference to FIG. 11 and the like, the central lamp heater 13C is supported by a support mechanism 34 in such a manner that a surface 26S of the sealing portion 26 and an XZ plane become parallel to each other. Also, a gap Ga is formed between the two sealing portions 26. Thus, the gas supplied from the air supply port 51 below the sealing portion 26 of the central lamp heater 13C can flow toward an upper side along the surface 26S of the sealing portion 26 while sufficiently being in contact with the surface 26S of the sealing portion 26. Thus, the sealing portion 26 is effectively cooled.

Also, the support mechanism 34 includes a first support member 36 and a second support member 37, and an opening Ma is provided between the first support member 36 and the second support member 37. In the opening Ma, a holding member 17 and a sealing portion 26 are not covered with the support mechanism 34. Thus, the gas supplied from the air supply port 51 can sufficiently make contact with a surface of the holding member 17. Thus, the holding member 17 is also effectively cooled.

Also, the gas is supplied from the air supply port 58 of the nozzle member 59 not only to the leading end side of the central lamp heater 13C but also to the wiring side of the central lamp heater 13C. The gas supplied from the air supply port 58 is supplied by the guide mechanism 60 to the sealing portion 27 of the central lamp heater 13C. As a result, an excessive temperature rise in the sealing portion 27 is controlled, and impairing of a sealing function of the sealing portion 27 is controlled.

Note that in the present embodiment, ends on the wiring side of the lamp heaters 13 which ends include sealing portions 27 and holding members 18 are arranged inside the inner cylindrical members 31. Thus, there is a possibility that the gas supplied from the air supply port 58 of the nozzle member 59 does not directly make contact with the sealing portions 27 and the holding members 18 on the wiring side of the lamp heaters 13. Since the gas guided by the guide mechanism 60 makes contact with external lead wires 19 on the wiring side of the lamp heaters 13, the external lead wires 19 are cooled. Thus, ends on the wiring side of the lamp heaters 13 which ends are connected to the external lead wires 19 are also cooled sufficiently via the external lead wires 19. Also, the gas guided by the guide mechanism 60 cools the external lead wire 19 on the wiring side of the central lamp heater 13C more intensively than the external lead wires 19 on the wiring side of the peripheral lamp heaters 13S. As a result, the central lamp heater 13C is cooled more intensively than the peripheral lamp heaters 13S.

Also, as described above, temperatures of the sealing portions 26 to which the external lead wires 19 are not connected are more likely to rise than those of the sealing portions 27 to which the external lead wires 19 are connected. In the present embodiment, a flow rate of the gas supplied from the air supply port 51 of the nozzle member 52 to the sealing portions 26 is higher than a flow rate of the gas supplied from the air supply port 58 of the nozzle member 59 to the sealing portions 27. Thus, the sealing portions 26 can be effectively cooled.

Also, in the present embodiment, the container holding mechanism 15 supports the container 12 in such a manner that the one ends 31A of the inner cylindrical members 31 are arranged above the other ends 31B of the inner cylindrical members 31. As a result, the gas a temperature of which rises and specific gravity of which is decreased inside the inner cylindrical members 31 can flow out of openings on a side of the one ends 31A of the inner cylindrical members 31 by a gravity action (convection action). At the one ends 31A, the holding members 17 are arranged outside the inner cylindrical members 31, and sufficient gaps are formed between the inner surfaces of the inner cylindrical members 31 and the upper surfaces 17A and the lower surfaces 17B of the holding members 17. Thus, the gas a temperature of which rises and specific gravity of which becomes small inside the inner cylindrical members 31 is smoothly discharged through the gaps between the inner surfaces of the inner cylindrical members 31 and the upper surfaces 17A and the lower surfaces 17B of the holding members 17.

[Effect]

As described above, according to the present embodiment, since the fluid heating device 4 includes the central lamp heater 13C and the peripheral lamp heaters 13S, it is possible to heat fluid with high output while making the fluid heating device 4 compact. Even when a large amount of fluid is supplied to the fluid space 33, the fluid can be effectively heated by radiant heat of the central lamp heater 13C and radiant heat of the peripheral lamp heaters 13S.

In the present embodiment, the plurality of peripheral lamp heaters 13S is arranged around the central lamp heater 13C, and the plurality of lamp heaters 13 is arranged in one container 12. Thus, it is possible to improve both output and compactness of the fluid heating device 4. On the other hand, since the central lamp heater 13C is surrounded by the peripheral lamp heaters 13S, there is a high possibility that a temperature of the central lamp heater 13C rises excessively. According to the present embodiment, the nozzle member 52 having the air supply port 51, and the guide mechanism 53 that guides the gas supplied from the air supply port 51 of the nozzle member 52 to the central lamp heater 13C are provided. Since cooling gas is sufficiently supplied to the central lamp heater 13C, an excessive temperature rise in the central lamp heater 13C is controlled even when the fluid heating device 4 has a high output. Thus, degradation in performance of the fluid heating device 4 is controlled.

As described above, when temperatures of the sealing portions 26 and the sealing portions 27 excessively rise, the metal foil 24 and the metal foil 25 are thermally expanded, and there is a possibility that sealing functions of the sealing portions 26 and the sealing portions 27 are impaired. According to the present embodiment, since the cooling gas is supplied to the sealing portions 26 and the sealing portions 27, it is possible to control impairing of the sealing functions of the sealing portions 26 and the sealing portions 27. Since the cooling gas is also supplied to the holding members 17 and the holding members 18, an excessive temperature rise in the sealing portions 26 and sealing portions 27 is effectively controlled.

The temperatures of the sealing portions 26 to which the external lead wires 19 are not connected is likely to rise more than those of the sealing portions 27 to which the external lead wires 19 are connected. In the present embodiment, since the sealing portions 26 are arranged outside the inner cylindrical members 31, a heat radiation effect of the sealing portions 26 can be improved. Also, since the holding members 17 are supported by the support mechanisms 34, relative positions between the inner cylindrical members 31, and the sealing portions 26 and the holding members 17 are maintained.

Also, the gas supplied from the gas supply source 68 is distributed to the first supply pipe 65 and the second supply pipe 66. A flow rate of the gas supplied from the air supply port 51 to the sealing portions 26 is higher than a flow rate of the gas supplied from the air supply port 58 to the sealing portions 27. The sealing portions 26 can be effectively cooled in a state in which the number of gas supply sources 68 is reduced.

Also, one ends 31A of the inner cylindrical members 31 are arranged above the other ends 31B of the inner cylindrical members 31. Thus, the gas which is heated inside the inner cylindrical members 31 and specific gravity of which is reduced is smoothly discharged from the openings in the one ends 31A of the inner cylindrical members 31 by a gravity action (convection action). Also, the holding members 17 arranged outside the inner cylindrical members 31 have the upper surfaces 17A and the lower surfaces 17B that are flat surfaces. As a result, sufficient gaps are provided between at least one of the upper surfaces 17A and the lower surfaces 17B and the inner surfaces of the inner cylindrical members 31. Thus, the gas inside the inner cylindrical members 31 is smoothly discharged through the gaps.

Also, in the present embodiment, the plurality of lamp heaters 13 is respectively arranged in the inner cylindrical members 31 in such a manner that postures in a rotation direction of the central axes BX of the inner cylindrical members 31 are coincident. The support mechanisms 34 support the holding members 17 in such a manner that postures of the inner cylindrical members 31 are maintained. Thus, usage conditions of the plurality of lamp heaters 13 are equalized. As a result, for example, the life of the plurality of lamp heaters 13 is equalized.

Each of the support mechanisms 34 has a first support member 36 that limits movement of a holding member 17 in the Z-axis direction, and a second support member 37 that limits movement of the holding member 17 in the Y-axis direction. Also, the first support member 36 sandwiches the holding member 17 between a first contact portion 36A and a second contact portion 36B by elastic force, and the second support member 37 sandwiches the holding member 17 between a third contact portion 37A and a fourth contact portion 37B by the elastic force. As a result, movement is limited not only in the Z-axis direction and the Y-axis direction of the holding member 17 but also in the X-axis direction of the holding member 17. Also, the support mechanism 34 has an opening Ma that exposes at least a part of the holding member 17. As a result, the gas supplied from the air supply port 51 can sufficiently make contact with a surface of the holding member 17. Thus, a high cooling effect can be acquired.

Second Embodiment

The second embodiment will be described. In the following description, the same sign is assigned to a component identical to that of the above-described embodiment, and a description thereof is simplified or omitted.

Figure 18:
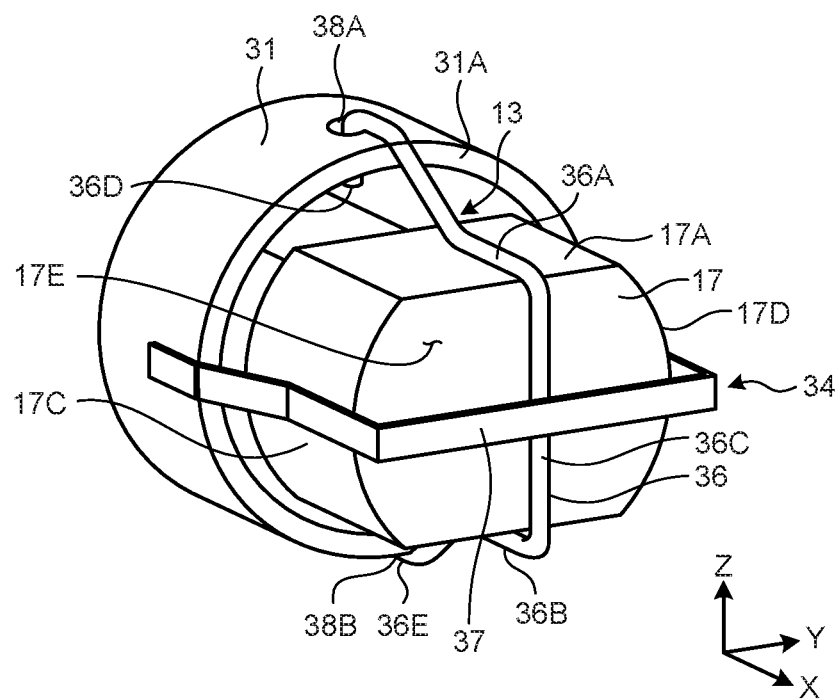
FIG. 18 is a perspective view illustrating a support mechanism of a lamp heater according to a second embodiment.

FIG. 18 is a perspective view illustrating a support mechanism 34 of a lamp heater 13 according to the present embodiment. Similarly to the above-described embodiment, an end on a +X side of the lamp heater 13 is supported by an inner cylindrical member 31 via a support mechanism 34.

The support mechanism 34 has a first support member 36 that limits movement of a holding member 17 in a Z-axis direction, and a second support member 37 that limits movement of the holding member 17 in a Y-axis direction.

The first support member 36 is a metallic wire-shaped member. The first support member 36 is elastically deformable. The first support member 36 includes a first contact portion 36A that makes contact with an upper surface 17A of the holding member 17, a second contact portion 36B that makes contact with a lower surface 17B of the holding member 17, a coupling portion 36C that couples the first contact portion 36A and the second contact portion 36B, a first insertion portion 36D inserted into a first through hole 38A provided in an upper part of the inner cylindrical member 31, and a second insertion portion 36E inserted into a second through hole 38B provided in a lower part of the inner cylindrical member 31. The second support member 37 is similar to the second support member 37 described in the above embodiment.

In the present embodiment, the first insertion portion 36D is inserted into the first through hole 38A from the outside of the inner cylindrical member 31. The second insertion portion 36E is inserted into the second through hole 38B from the outside of the inner cylindrical member 31.

Also in the present embodiment, the support mechanism 34 can maintain relative positions between the inner cylindrical member 31 and the lamp heater 13.

Third Embodiment

The third embodiment will be described. In the following description, the same sign is assigned to a component identical to that of the above-described embodiment, and a description thereof is simplified or omitted.

Figure 19:
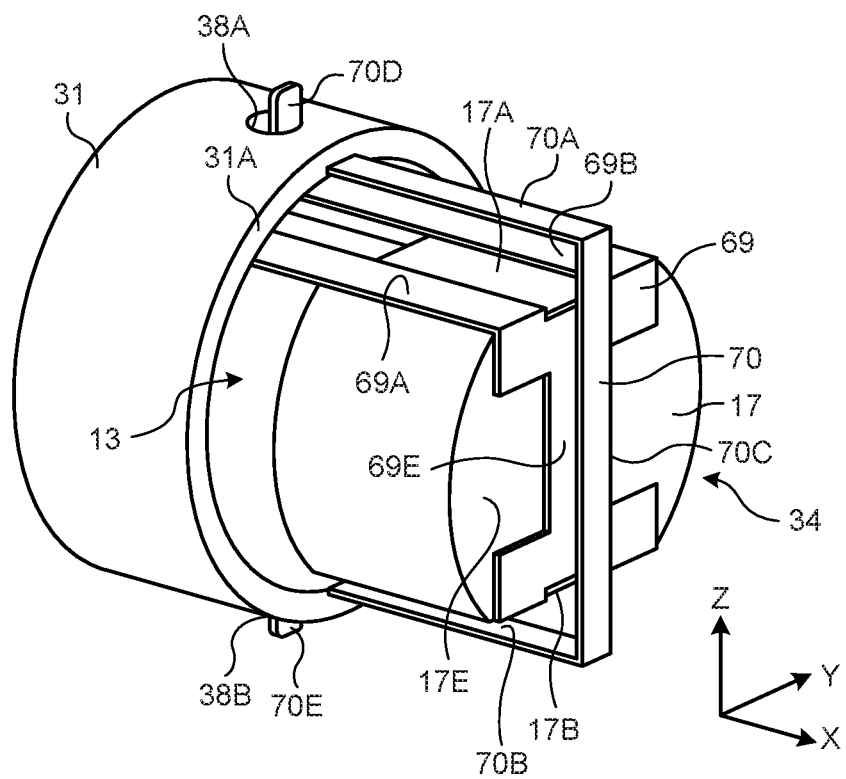
FIG. 19 is a perspective view illustrating a support mechanism of a lamp heater according to a third embodiment.

FIG. 19 is a perspective view illustrating a support mechanism 34 of a lamp heater 13 according to the present embodiment. Similarly to the above-described embodiment, an end on a +X side of the lamp heater 13 is supported by an inner cylindrical member 31 via a support mechanism 34.

The support mechanism 34 includes a support member 69 fixed to a holding member 17, and a support member 70 coupled to the inner cylindrical member 31.

Figure 20:
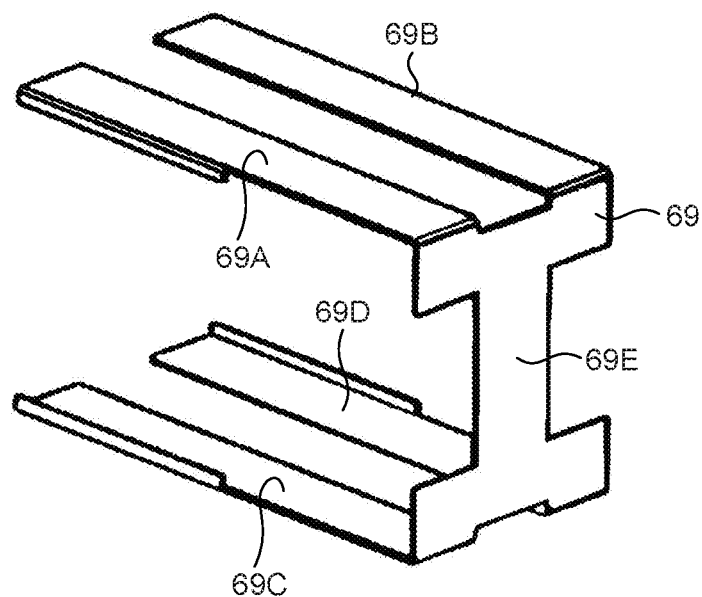
FIG. 20 is a perspective view illustrating a support member according to the third embodiment.

FIG. 20 is a perspective view illustrating the support member 69 according to the present embodiment. As illustrated in FIG. 19 and FIG. 20, the support member 69 is a metallic thin plate member. The support member 69 is elastically deformable. The support member 69 includes a contact portion 69A (first contact portion) and a contact portion 69B (first contact portion) that make contact with an upper surface 17A of the holding member 17, a contact portion 69C (second contact portion) and a contact portion 69D (second contact portion) that make contact with a lower surface 17B of the holding member 17, and a coupling portion 69E that makes contact with an end surface 17E on the +X side of the holding member 17. The coupling portion 69E couples the contact portion 69A and the contact portion 69B with the contact portion 69C and the contact portion 69D.

The support member 70 is a metallic thin plate member. The support member 70 is elastically deformable. The support member 70 includes a facing portion 70A that faces the upper surface 17A of the holding member 17, a facing portion 70B that faces the lower surface 17B of the holding member 17, a facing portion 70C that faces the end surface 17E on the +X side of the holding member 17, an insertion portion 70D inserted into a first through hole 38A provided in an upper part of the inner cylindrical member 31, and an insertion portion 70E inserted into a second through hole 38B provided in a lower part of the inner cylindrical member 31. The insertion portion 70D is inserted into the first through hole 38A from the inside of the inner cylindrical member 31. The insertion portion 70E is inserted into the second through hole 38B from the inside of the inner cylindrical member 31.

The support member 69 is fixed to the holding member 17. The support member 69 sandwiches the holding member 17 between the contact portion 69A and the contact portion 69B, and the contact portion 69C and the contact portion 69D by elastic force.

In a state in which the support member 69 is fixed to the holding member 17, the support member 69 is arranged in contact with (placed on) an inner surface of the inner cylindrical member 31. Leading ends of the contact portion 69A and the contact portion 69B make contact with the inner surface of the inner cylindrical member 31, and leading ends of the contact portion 69C and the contact portion 69D make contact with the inner surface of the inner cylindrical member 31, whereby the support member 69 is fixed to the inner cylindrical member 31. Also, the insertion portion 70D is inserted into the first through hole 38A, the insertion portion 70E is inserted into the second through hole 38B, and the support member 70 and the cylindrical member 31 are coupled to each other, whereby movement of the lamp heater 13 in the X-axis direction is restricted.

Fourth Embodiment

The fourth embodiment will be described. In the following description, the same sign is assigned to a component identical to that of the above-described embodiment, and a description thereof is simplified or omitted.

In the present embodiment, modified examples of a support mechanism 34 and a support mechanism 35 will be described.

Figure 21:
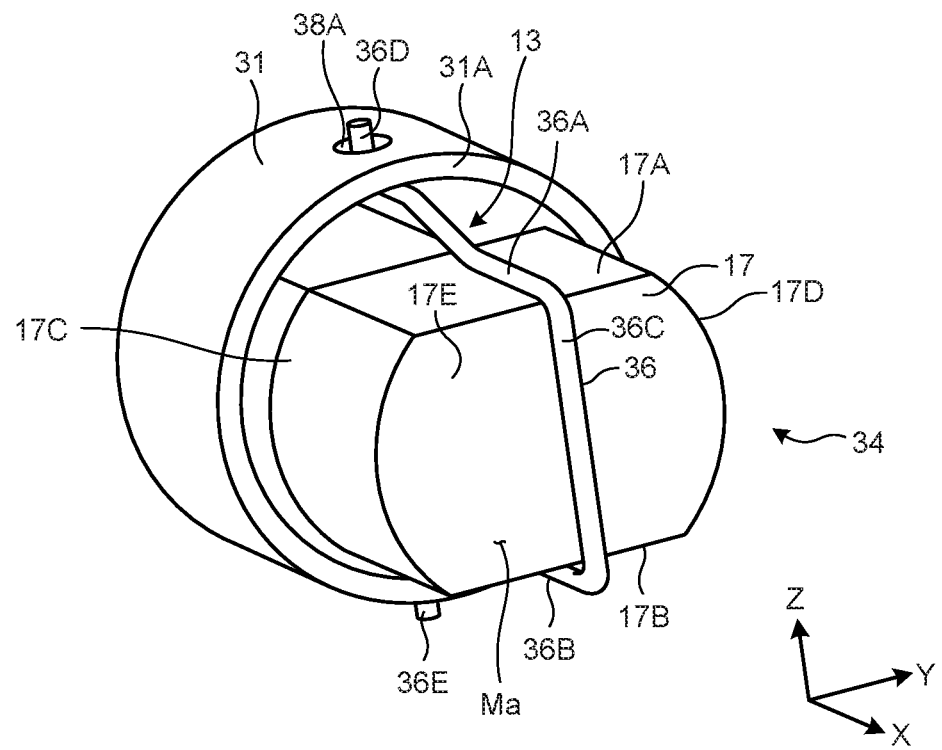
FIG. 21 is a perspective view illustrating a support mechanism of a lamp heater according to a fourth embodiment.

FIG. 21 is a perspective view illustrating a support mechanism 34 of a lamp heater 13 according to the present embodiment, and illustrating a modification example of the support mechanism 34 described with reference to FIG. 13. As illustrated in FIG. 21, in the support mechanism 34 described with reference to FIG. 13, a second support member 37 may be omitted. The support mechanism 34 can support a leading end side of the lamp heater 13 by a first support member 36.

Figure 22:
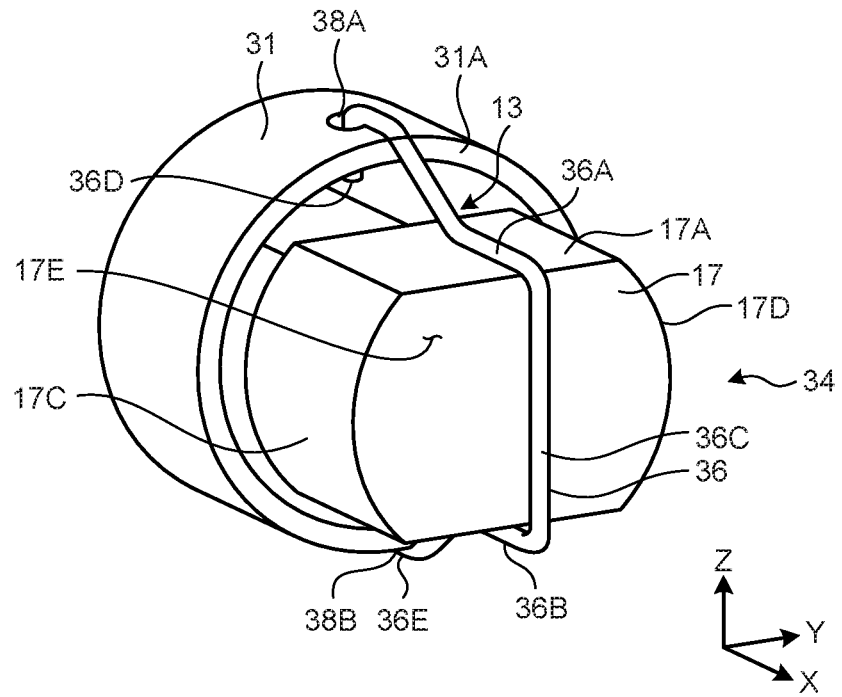
FIG. 22 is a perspective view illustrating the support mechanism of the lamp heater according to the fourth embodiment.

FIG. 22 is a perspective view illustrating a support mechanism 34 of a lamp heater 13 according to the present embodiment, and illustrating a modification example of the support mechanism 34 described with reference to FIG. 18. As illustrated in FIG. 22, in the support mechanism 34 described with reference to FIG. 18, a second support member 37 may be omitted. The support mechanism 34 can support a leading end side of the lamp heater 13 by a first support member 36.

Figure 23:
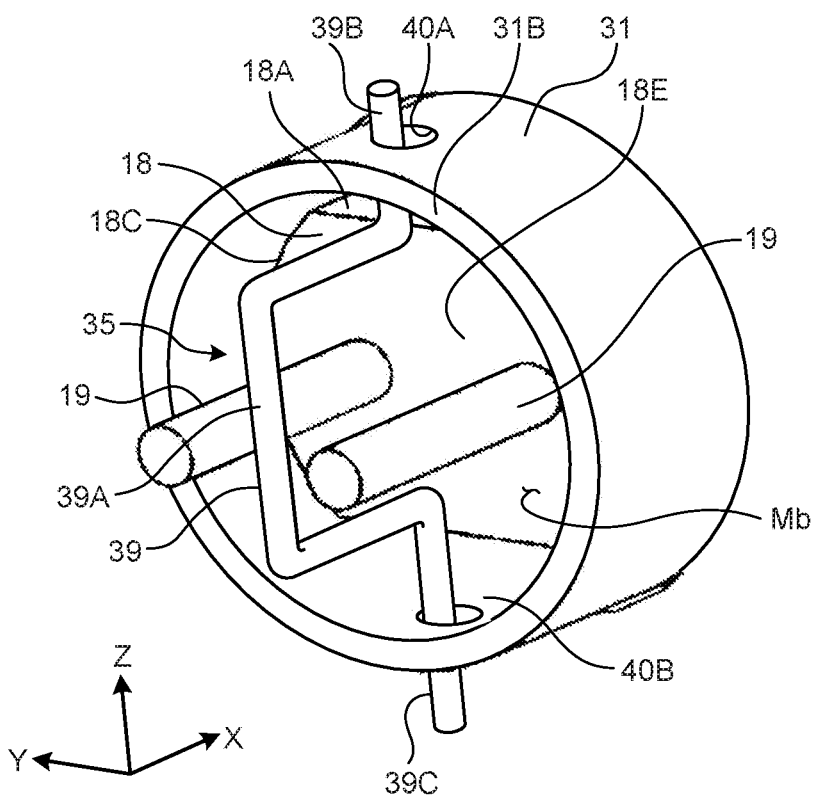
FIG. 23 is a perspective view illustrating the support mechanism of the lamp heater according to the fourth embodiment.

FIG. 23 is a perspective view illustrating a support mechanism 35 of a lamp heater 13 according to the present embodiment, and illustrating a modification example of the support mechanism 35 described with reference to FIG. 14. The support member 39 described with reference to FIG. 14 is a thin plate member. As illustrated in FIG. 23, a support member 39 may have a wire shape (round bar shape).

Different Embodiment

In the above-described embodiment, gas supplied from an air supply port 81 and an air supply port 88 may not be air, and may be an inert gas, for example.

A guide mechanism 53 may guide the gas not only to a central lamp heater 13C but also to a peripheral lamp heater 13S.

Not only a leading end side of a lamp heater 13 but also a wiring side of the lamp heater 13 may be arranged outside an inner cylindrical member 31.

The invention claimed is:

1. A fluid heating device comprising:
a container which has an outer cylindrical member and inner cylindrical members arranged inside the outer cylindrical member, fluid being supplied to a fluid space between an inner surface of the outer cylindrical member and outer surfaces of the inner cylindrical members in the container;
lamp heaters arranged in the inner cylindrical members;
a first nozzle member arranged on a leading end side of the lamp heaters and having an air supply port; and
a first guide mechanism that guides first gas supplied from the air supply port of the first nozzle member, wherein
the inner cylindrical members include a central inner cylindrical member arranged at a center of the outer cylindrical member in a plane orthogonal to a central axis of the outer cylindrical member, and a plurality of peripheral inner cylindrical members arranged around the central inner cylindrical member,
the lamp heaters include a central lamp heater arranged in the central inner cylindrical member, and peripheral lamp heaters respectively arranged in the plurality of peripheral inner cylindrical members, and
the first guide mechanism guides the first gas to a leading end side of the central lamp heater.

2. The fluid heating device according to claim 1, wherein the first gas guided by the first guide mechanism cools the leading end side of the central lamp heater more intensively than the leading end side of the peripheral lamp heaters.

3. The fluid heating device according to claim 1, wherein each of the lamp heaters includes a sealed body, a filament arranged in an internal space of the sealed body, sealing portions that are provided at ends of the sealed body and that seal the internal space, and metal foil arranged in the sealing portions and connected to the filament, and
the first guide mechanism guides the first gas to the sealing portion on the leading end side of the central lamp heater.

4. The fluid heating device according to claim 3, wherein each of the lamp heaters has two lamp bodies arranged in parallel,
each of the lamp bodies has the sealed body, the filament, the sealing portions, and the metal foil,
holding members that hold the sealing portions of one of the lamp bodies and the sealing portions of the other lamp body are further included, and
the first guide mechanism guides the first gas to the holding member on the leading end side of the central lamp heater.

5. The fluid heating device according to claim 4, wherein the sealing portions include a first sealing portion provided on the leading end side of each of the lamp bodies and a second sealing portion provided on a wiring side of each of the lamp bodies,
the holding members include a first holding member that holds at least a part of the first sealing portions of the one lamp body and the other lamp body, and a second holding member that holds at least a part of the second sealing portions of the one lamp body and the other lamp body,
metal foil arranged in the first sealing portion of the one lamp body and metal foil arranged in the first sealing portion of the other lamp body are connected on the leading end side, and
each piece of metal foil arranged in the second sealing portions of the one lamp body and the other lamp body is connected to an external lead wire on the wiring side.

6. The fluid heating device according to claim 5, further comprising:
a support mechanism that supports the first holding members in a state in which a part on the leading end side of the lamp heaters is arranged outside the inner cylindrical members.

7. The fluid heating device according to claim 6, wherein each of the first holding members has an upper surface that is a flat surface, a lower surface that is a flat surface, and a side surface that connects the upper surface and the lower surface, and
a gap is provided between at least one of the upper surface and the lower surface and an inner surface of each of the inner cylindrical members.

8. The fluid heating device according to claim 7, wherein each of the support mechanisms includes a support member having a first contact portion that makes contact with the upper surface, a second contact portion that makes contact with the lower surface, a first insertion portion inserted into a first through hole provided in an upper part of each of the inner cylindrical members, and a second insertion portion inserted into a second through hole provided in a lower part of the inner cylindrical member,
the first insertion portion is inserted into the first through hole from an inside of the inner cylindrical member, and
the second insertion portion is inserted into the second through hole from the inside of the inner cylindrical member.

9. The fluid heating device according to claim 7, wherein each of the support mechanisms includes a support member having a first contact portion that makes contact with the upper surface, a second contact portion that makes contact with the lower surface, a first insertion portion inserted into a first through hole provided in an upper part of each of the inner cylindrical members, and a second insertion portion inserted into a second through hole provided in a lower part of the inner cylindrical member,
the first insertion portion is inserted into the first through hole from an outside of the inner cylindrical member, and
the second insertion portion is inserted into the second through hole from the outside of the inner cylindrical member.

10. The fluid heating device according to claim 7, wherein each of the support mechanisms includes a support member having a first contact portion that makes contact with the upper surface, a second contact portion that makes contact with the lower surface, and a coupling portion that couples the first contact portion and the second contact portion, and
the support member is arranged in contact with an inner surface of each of the inner cylindrical members in a state in which the support member is fixed to the first holding member.

11. The fluid heating device according to any claim 7, wherein the lamp heaters are respectively fixed to the inner cylindrical members in such a manner that the flat surfaces of the first holding members are vertical when viewed in a horizontal direction.

12. The fluid heating device according to claim 5, further comprising:

a second nozzle member arranged on the wiring side of the lamp heaters and having an air supply port, and a second guide mechanism that guides second gas supplied from the air supply port of the second nozzle member, wherein the second guide mechanism guides the second gas to the wiring side of the central lamp heater, and a flow rate of the first gas supplied from the air supply port of the first nozzle member is higher than a flow rate of the second gas supplied from the air supply port of the second nozzle member.

13. The fluid heating device according to claim 12, wherein the second gas guided by the second guide mechanism cools the external lead wire, and the wiring side of the central lamp heater is cooled via the external lead wire.

14. The fluid heating device according to claim 13, wherein the second gas guided by the second guide mechanism cools the wiring side of the central lamp heater more intensively than the wiring side of the peripheral lamp heaters.

15. The fluid heating device according to claim 12, wherein the first sealing portions are arranged at one ends of the inner cylindrical members and the second sealing portions are arranged at the other ends of the inner cylindrical members, and a container holding mechanism that holds the container in such a manner that the one ends of the inner cylindrical members are arranged above the other ends of the inner cylindrical members is further included.

16. The fluid heating device according to claim 1, wherein the container is made of transparent quartz glass.

* * * * *